United States Patent
Otsuka et al.

(10) Patent No.: US 6,630,629 B2
(45) Date of Patent: Oct. 7, 2003

(54) WIRING SUBSTRATE

(75) Inventors: Kanji Otsuka, Kohan 2-1074-38, Higashiyamato-Shi, Tokyo (JP); Tamotsu Usami, Nishi-Machi 2-38-4, Kokubunji-Shi, Tokyo (JP)

(73) Assignees: Sanyo Electric Co., Ltd., Moriguchi (JP); Oki Electric Industry Co., Ltd., Tokyo (JP); Sharp Kabushiki Kaisha, Osaka (JP); Sony Corporation, Tokyo (JP); Kabushiki Kaisha Toshiba, Kawasaki (JP); NEC Corporation, Tokyo (JP); Hitachi, Ltd., Tokyo (JP); Fujitsu Limited, Kawasaki (JP); Matsushita Electronics Corporation, Osaka (JP); Mitsubishi Denki Kabushiki Kaisha, Tokyo (JP); Rohm Co., Ltd., Kyoto (JP); Kanji Otsuka, Higashiyamato (JP); Tamotsu Usami, Kokubunji (JP)

( * ) Notice: Subject to any disclaimer, the term of this patent is extended or adjusted under 35 U.S.C. 154(b) by 2 days.

(21) Appl. No.: 10/228,305

(22) Filed: Aug. 27, 2002

(65) Prior Publication Data
US 2003/0006063 A1 Jan. 9, 2003

Related U.S. Application Data

(62) Division of application No. 09/731,933, filed on Dec. 8, 2000, now Pat. No. 6,476,330.

(30) Foreign Application Priority Data
Jan. 27, 2000 (JP) ..................................... 2000-018167

(51) Int. Cl.$^7$ .................................................. H05K 1/03
(52) U.S. Cl. ..................................... 174/255; 361/803
(58) Field of Search .............................. 174/255, 261; 361/792, 795, 803

(56) References Cited

U.S. PATENT DOCUMENTS

| | | | | |
|---|---|---|---|---|
| 4,297,542 A | * | 10/1981 | Shumway | 200/6 A |
| 5,003,622 A | * | 3/1991 | Ma et al. | 455/327 |
| 5,355,283 A | * | 10/1994 | Marrs et al. | 361/760 |
| 6,476,330 B2 | * | 11/2002 | Otsuka et al. | 174/261 |
| 6,504,109 B1 | * | 1/2003 | Aval et al. | 174/261 |
| 6,528,732 B1 | * | 3/2003 | Okubora et al. | 174/255 |

* cited by examiner

Primary Examiner—David L. Talbott
Assistant Examiner—Jeremy Norris
(74) Attorney, Agent, or Firm—Morrison & Foerster LLP

(57) ABSTRACT

Signal wirings 22, 23 are formed on a pair of substrates 20, 21, and the substrates are joined together through an insulating layer 24 so that the signal wirings 22, 23 are placed in parallel and facing to each other. The surfaces of the overlapping faces of the signal wirings 22, 23 are made smooth, and the roughness of the same surfaces is smaller than the skin depth $\delta_s$ due to the skin effect, preferably less than one third, for minimizing the increase in the electric resistance due to the skin effect.

13 Claims, 12 Drawing Sheets

$b/(a+t) > 2$

Common Mode $$L_{effc} = L_{S1} + L_{S2} + 2M$$

Differential Mode $$L_{effc} = L_{S1} + L_{S2} - 2M$$

WIRING SUBSTRATE

This application is a division of Ser. No. 09/731,933, filed Dec. 8, 2000, now U.S. Pat. No. 6,476,330, the entire disclosure of which is incorporated by reference as if fully set forth herein.

BACKGROUND OF THE INVENTION

1. Field of the Invention

The present invention relates to a wiring substrate having a signal wiring suitable for transmitting high frequency digital signals, and a process for producing the same. Especially, the invention relates to a wiring substrate having a specific signal-wiring configuration for enabling high-speed transmission of high frequency digital signals in digital systems having components such as CPU and main memory, and a process for producing the same.

2. Prior Art

Conventional wiring substrates and processes for producing them will be reviewed hereinafter.

In digital systems, digital signals, in other words, pulse signals, are used. In terms of sine-wave frequency convolution, the pulse signals have higher harmonic components. For example, a pulse signal of 200 MHz has third order sine-wave harmonics and fifth order sine-wave harmonics, with relative amounts measured in energy being about 30% and 10%, respectively. Thus, at the pulse signal of 200 MHz, it is required to design a transmission line configuration taking account of the frequency component of 1 GHz sine wave.

FIG. 12 shows a wiring substrate for a digital system having integrated circuit chips, which was examined by the inventors of the present invention as a typical example of the transmission line design for high frequencies. A CPU 2 and a main memory 3 are mounted on a wiring substrate 1. The CPU 2 and the main memory 3 are connected by a plurality of signal wirings 4, the number of which is determined by the number of the bits of the signal, for transmitting the digital signals.

Recently, as the developments in the high-speed CPU 2 are being accelerated, those with the operation frequencies as high as 400 MHz to 733 MHz have been developed. However, the frequency range of the digital signals allowed on the current print wiring boards is 133 to 200 MHz. This does not permit the signal wiring 4 to accommodate the higher frequencies of the digital signals transmitted form the CPU 2, resulting in a typical inconvenience that the data is not stored in the main memory 3.

Thus, the example above will need a development of a transmission line suitable for a frequency range of 2 GHz to 3 GHz in terms of the sine-wave frequency convolution of the digital signals. This proves that the design for transmission lines of a print wiring board now has to deal with GHz frequency range in digital systems.

Furthermore, in comparison to a RF (Radio Frequency) system, a digital system has a number of signals, more than 64 bits for example, being transmitted in parallel. This creates more difficult issues for the high frequency digital systems than the RF systems.

SUMMARY OF THE INVENTION

According to the present invention, it is possible to provide a wiring substrate structure and a manufacturing method thereof for transmitting high frequency digital signals.

The understanding of the phenomena involved in the transmission of the high frequency signals through the wiring lines is a crucial ingredient of the present invention, and now will be described hereinafter, before the description of the realization of the invention.

The difficulties confronted in the design of the high frequency digital signals in the GHz range are categorized in three issues. The first is that it is difficult to keep the characteristic impedance constant among the large number of bit wirings running in parallel. As the characteristic impedance changes depending on the interference from the neighboring wirings, it is required to eliminate most of the neighboring interference (the interference from the neighboring wirings).

A few designs for the high frequency wiring structure have been proposed in Japanese Laid-Open Patent Publication No. 11-284126. The idea is to suppress the neighboring interference by making a signal wiring pair by pairing two signal wirings, and by making the distance between signal and ground shorter than the distance between neighboring signal wiring pairs, for increasing the coupling between the two signal wirings composing a signal wiring pair.

One important point which needs attention is that higher reproducibility of the configuration and the size of the signal wiring is needed to keep the characteristic impedance constant, creating a need for a production process with even higher accuracy. Specifically, for example, the distance between the neighboring signal wiring pairs and the distance between the two signal wirings composing a signal wiring pair should be controlled so that the two distances are kept constant respectively. The wiring structures disclosed in the above Japanese Laid-open Patent Publication, however, do not satisfy this need.

The second is that the electric current flows only near the surface of the signal wiring while high frequency signals being supplied to the signal wiring, resulting in the reduction of the effective cross section of the electric current, and thereby in an increase in the DC current resistance and a decrease in the signal amplitude. This is called skin effect.

The inventors of the present invention have found that the skin effect is one of the major contributors degrading the transmission characteristics of the conventional signal wirings. Thus, the skin effect will be reviewed hereinafter extensively.

FIGS. 13A, 13B and FIGS. 14A, 14B are conceptual views for describing the skin effect occurring in the signal wirings. When DC current 6 flows through signal line 5 as shown in FIG. 13A, the DC current 6 flows with a same density all across the cross-section of the signal line 5.

If a high frequency signal is supplied to the signal line 5, the current flows in one direction, stops and then flows in opposite direction, and this sequence is repeated with a high speed. It is known that lines of magnetic force are generated around an electric current. Thus, while a high frequency signal is supplied, a cycle of generation and annihilation of the line of magnetic force is added to the sequence of the current flow comprising a flow in one direction, a stop of flow, and a flow in an opposite direction. The line of magnetic force can be perceived as having inertia in a similar manner as the mass has in dynamics. In other words, energies are required for generating line of magnetic force once the same is annihilated.

When the signal line 5 is considered as an assembly of a number of thin lines, the lines of magnetic force generated around the electric current elements 7 flowing through each thin line have the same direction. Thus, the lines of magnetic force generated around neighboring electric current elements collide each other and create a high-energy state.

Thus, following the principal of the nature, the electric current density becomes higher only near the surface of the signal line 5, as shown in FIG. 13B, so that the energy of the electro-magnetic system is minimized.

This happens, as the energy state is lower near the surface of the signal line 5 due to the suppressed mutual interference among the neighboring lines of magnetic force. This is the cause of the skin effect. However, having the skin with high electric current density all around the surface of signal line 5 is achieved under an assumption that a ground 9 is placed near the signal line 5.

Under the assumption above, the electric current flows only near the surface all around the contour of the signal line. The skin depth $\delta_s$ is obtained by the following relation.

$$\delta_s = \sqrt{2/\omega\mu_y\sigma} \quad (1)$$

And the skin depth is in proportional to $\sqrt{2\pi/\omega}$.

In the equation above, $\omega$ denotes an angular frequency, $\mu_y$ the magnetic permeability of the signal line conductor, and $\sigma$ the electric conductivity of the signal line conductor. Assuming a Cu (Copper) wiring and 1 GHz sine wave, the skin depth is 2.2 $\mu$m. More than 60% of the electric current flows within this depth, and almost 100% of the electric current flows within the depth of 5 $\mu$m.

Now, the case of the signal wiring pair made by paring two signal wirings, or stacked pair lines, will be investigated hereinafter, as the same configuration constitutes an integral part of the present invention. It is assumed that a signal line 10 and a reference line 11 run in parallel as shown in FIG. 14A.

In this configuration, the currents flow in opposite directions to each other through the signal line 10 and the reference line 11. As a result, the direction of the lines of magnetic force generated by the electric current flowing through the signal line 10 is opposite to the direction of the lines of magnetic force generated by the electric current flowing through the reference line 11, and thus the lines of magnetic force of the opposite directions function to sustain themselves.

For minimizing the energy of the electromagnetic system, the electric current density becomes higher near the surfaces of the overlapping faces of the signal line 10 and the reference line 11, as indicated by the shaded area in FIG. 14A. On the both sides of the signal line 10 and the reference line 11, the electric current density becomes higher near the portion of the surface close to the overlapping faces. The skin depth $\delta_s$ of the surfaces of the overlapping faces of the signal line 10 and the reference line 11 can be obtained by the equation 1 as an approximation.

In general, a reference line denotes a ground line which is represented by the idea that a ground is stable, or without "fluctuation", as the earth ground is supposed to be. However, in reality, the electric potential of the ground line has "fluctuation", and in recent electromagnetics it is referred as reference line or reference plane.

The mechanism of the generation of the skin effect will be further examined hereinafter using an equivalent circuit. FIG. 14B is an equivalent circuit of the signal line shown in FIG. 14A. In general, a signal line longer than the wavelength of the signal is represented by a distributed constant circuit having self-inductances LS1 and LS2, a mutual inductance M, and a coupling capacitance C.

Dividing the signal line 10 and the reference line 11 into the thin lines as shown in FIG. 14A, the equivalent circuit can be applied to the relation between the neighboring thin lines. The same equation can be applied to the relation between the signal line 10 and the reference line 11. Further, the signal line 10 and the reference line 11 can be divided into the thin lines in any manner suitable.

When the directions of the electric currents are identical, the state thereof is referred as a common mode and the effective inductance thereof is denoted by Leffc. On the other hand, the state is referred as a differential mode and the inductance is denoted by Leffd when the directions of the electric currents are opposite. This provides the following relations.

$$Leffc = LS1 + LS2 + 2M, \quad Leffd = LS1 + LS2 - 2M$$

Thus, depending on the directions of the electric currents, the common mode is applied to the relations between the thin lines inside the signal line 10 and reference line 11, and the differential mode is applied to the relation between the signal line 10 and the reference line 11. This makes the electric currents flow through the low inductance region, and the electric current density becomes high near the surfaces of the overlapping faces of the signal line 10 and the reference line 11 keeping only limited electric current flow inside the both lines as shown in FIG. 14A. In other words, the electric currents are distributed so that the energy of the electromagnetic system is minimized.

As a result, the lines of electric force E and the lines of magnetic force H are generated outside the signal line 10 and the reference line 11 as shown in the same figure. The electromagnetic field around a wiring is generally extended into the ambience due to the fringe effect. However, the interference between the neighboring lines can be mostly eliminated by making the coupling coefficient close to 1 and thus localizing the electromagnetic field.

Then, the stacked pair lines will be compared to so-called micro strip lines for further understanding the characteristics of the skin effect. FIG. 15 is a conceptual view for describing the skin effect of the micro strip line. The figure has a signal line 12 and a reference plane 13. A virtual line appears as a imaginary part 14 of the signal line 12 with the reference plane 13 working as a symmetry plane.

In this configuration, the lines of electric force E are generated so that the signal line 12 and the imaginary part 14 are connected by the lines. The boundary condition is such that the lines of electric force E should be perpendicular to the reference plane 13. Thus, the lines of electric force E are extended along the reference plane 13 as shown in the same figure. Naturally, the electric current flows in an area wider than the width W of the signal line 12 on the surface of the reference plane 13. This is an advantage of a signal wiring pair under the effect of the skin effect since a signal wiring pair has less neighboring effect than a micro strip line.

In summary of the above discussion on the skin effect of a signal wiring, the electric currents flow near the surface all around contour of the signal line when a ground is placed in the ambience all around the contour of the signal line. However, in the micro strip lines and the stacked pair lines, the electric currents flow only near the surface facing a ground.

If the surfaces of the overlapping faces of the signal wiring pair are coarsened for obtaining an anchoring effect in expectation of a stronger adhesion between the metal wirings and the wiring substrates, the electric currents flow along the irregular contour of the rough surface, resulting in a longer electric current path and thus a lager DC current resistance loss. This further compounds the adverse influence of the skin effect on the transmission characteristics of the wiring substrates.

The third is that without reducing the dielectric loss, tan δ, of the insulating material surrounding the wirings the electric current leak between the wirings becomes large and dissipates as heat, resulting in a decrease in the signal energy. In the present invention, it is inevitable to use some form of insulating material between a couple of the wiring substrates for adhering the same. The amount of the electric current leak is represented by a leaking conductance G of the transmission lines.

The conductance above is obtained by the following relation.

$$G = k\omega C_0 \tan\delta$$

In the equation above, k denotes the insulator shielding rate of the transmission lines, ω the angular frequency, and $C_0$ the capacitance between a signal and a ground in vacuum. As seen from the equation, increasing the angular frequency by one order of magnitude will require reducing tan δ of the insulating material by one order of magnitude.

For reducing tan δ of the insulating material, the polarized molecular structures in the insulating material should be eliminated as much as possible. In organic materials, this is to remove polarized groups from primary chains and sub chains.

On the other hand, metal wirings are adhered to organic materials through the polarized groups. Thus, there is an issue of the tradeoff between reducing the dielectric loss and obtaining high adhesion strength between organic materials and metal wirings. In general, the solution is to use the anchoring effect of organic materials to the irregular surface of the metal wirings, which are coarsened prior to the adhesion.

In the previous section, three issues are identified as difficulties or inconveniences in providing a wiring lines used with high frequency digital signals. The first issue is to eliminate the neighboring interference between signal wirings for lowering the characteristic impedance and keeping the same constant. The second issue is to minimize the increase in the electric resistance due to the skin effect occurring in signal wiring systems for preventing the attenuation of high frequency signals, and to enable the transmission of high frequency digital signals in GHz range. The third issue is to reduce the dielectric loss of insulating materials surrounding wirings for achieving the high efficiency transmission of high frequency digital signals.

Typical examples of the present invention will be summarized hereinafter.

The wiring substrate based on the 1st feature of the present invention includes:

one or a plurality of first signal wirings formed on a primary plane of a first substrate;

one or a plurality of second signal wirings formed on a primary plane of a second substrate;

insulating material inserted between a primary plane of the first substrate and a primary plane of the second substrate, and the first and the second signal wirings are placed in parallel facing to each other for creating a signal wiring pair.

The structure above is the basic configuration of the wiring substrates of the present invention and enables high-speed transmission of high frequency signals without attenuations.

In the wiring substrate based on the 2nd feature of the invention which further defines the 1st feature of the invention, the surface roughness of the surfaces of the overlapping faces of the first and the second signal wirings is smaller than the skin depth of the skin effect caused by supplying high frequency signals to the signal wiring pair.

In this configuration, the electric current density becomes higher, due to the skin effect, near the surfaces of the overlapping faces of the first and the second signal wirings, and the increase of the electric resistance caused by the skin effect is minimized since the roughness of the surfaces of the overlapping faces of the first and the second signal wirings is smaller than the skin depth due to the skin effect. Ideally, a mirror plane free from the surface roughness is desirable, but making the surface roughness smaller than the skin depth due to the skin effect can sufficiently suppress the increase in the electric resistance. Thus, the attenuation of the high frequency signals can be prevented and high-speed signal transmission can be achieved.

In the wiring substrate based on the 3rd feature of the invention which further defines the 1st and the 2nd features of the invention, where a plurality of sets of the signal wiring pairs are formed close to each other, the first and the second wirings are placed so that the following relation is obtained among the distance between the first and the second signal wirings, t, the line width of the first and the second wiring, a, and the distance between neighboring signal wiring pairs, b:

$$b/(a+t) > 2.$$

In this configuration, the coupling coefficient becomes close to 1 and the neighboring interference between neighboring signal wiring pairs can be practically annihilated. Thus the same configuration can provide an ideal wiring without the loss of the electromagnetic energy.

In the wiring substrate based on the 4th feature of the invention which further defines the 3rd feature of the invention, the signal wiring pairs have a characteristic impedance lower than 15 Ω. The same configuration is desirable for transmitting high frequency digital signals in GHz range.

In the wiring substrate based on the 5th feature of the invention which further defines the 1st feature of the invention, the insulating material fills up the entire gap between the first and the second substrates. In this configuration, the insulating materials are used for joining the first and the second substrates. It is desirable to choose insulating materials with low dielectric constant, or low tan δ, for reducing the leak current due to the dielectric loss between the signal wirings.

In the wiring substrate based on the 6th feature of the invention which further defines the 1st feature of the invention, the insulating material is partially inserted into the space between the neighboring signal wiring pairs, and a gas is sealed into the space surrounded by the first and the second signal wirings, and the insulating material.

In the 5th feature of the invention, as the insulating material fills the entire space, the dielectric characteristics is generally degraded even when a low tan δ material is used, compared to the case where a gas is inserted. Thus, in the wiring substrate of the 6th feature of the invention, a gas is sealed into the space between the overlapping faces, which is the area for the highest electromagnetic energy and, thus, dominates the dielectric loss characteristics.

In this configuration, as the space between the overlapping faces of the first and the second signal wirings is filled with a gas, only the fringe effect accounts for the dielectric loss. Thus, the dielectric loss thereof can be neglected even when the insulating material supporting the substrates has more or less high tan δ.

In the wiring substrate based on the 7th feature of the invention which further defines the 1st feature of the invention, the insulating material is placed partially in the space between the neighboring signal wiring pairs away from the edge of the signal wiring pairs, and a gas is sealed into the space surrounded by the first and the second signal wirings, and the insulating material. This configuration can eliminate the dielectric loss including the fringe effect occurring at the signal wiring pairs. Further, this configuration has a structure which makes it easier to control the distance between the surfaces of the signal wiring pair than the structure of the 6th feature of the invention. This advantage will be described in detail hereinafter.

In the wiring substrate based on the 8th feature of the invention which further defines the 1st feature of the invention, the insulating material is formed as a coating layer on the first and the second substrates having the first and the second signal wirings thereon, the coating layers are joined together on the first and the second signal wirings, and a gas is sealed into the space between signal wiring pairs.

In this configuration, it is easy to control the distance between the signal wirings of the signal wiring pairs as the thickness of the coating layer determines the same distance. It is desirable to form the coating layer using a material with a low tan δ.

In the wiring substrate based on the 9th feature of the invention which further defines the 6th, 7th, and 8th features of the invention, the gas is a non-polarized gas. The candidates for the non-polarized gas include helium, argon, methane, ethane, and the air from which at least the moisture is removed.

The wiring substrate based on the 10th feature of the invention includes:
  a plurality of substrates laminated using insulating materials in between, so that first signal wirings and second signal wirings formed on the substrates are placed in parallel facing to each other for forming a plurality of layers of signal wiring pairs;
  buried via formed through the substrates or formed through the substrates and supporting structures for the substrates in the layers for interconnecting the signal wiring pairs in the layers.

This configuration permits the lamination of the signal wiring pairs using the wiring substrate of the 1st feature of the invention as a basic structural unit, and enables high-density wiring substrates.

In the wiring substrate based on the 11th feature of the invention which further defines the 10th feature of the invention, pads for electric connection are formed on the substrate in the upper most layer among the plurality of laminated substrates, and the pads for electric connection are connected to the signal wiring pairs in the layers by buried via formed through the substrates or by buried via formed through the substrates and the insulating material in the layers. Then, electric components are mounted on the substrate in the upper most layer using the pads for electric connection.

This configuration enables the mounting of electronic components onto the wiring substrates having laminated signal wiring pairs, which is disclosed in the 10th feature of the invention.

In the wiring substrate based on the 12th feature of the invention which further defines the 10th and the 11th feature of the invention, the buried via is formed on via lands extended from the first signal wirings and the second signal wirings.

The wiring substrate based on the 13th feature of the invention which further defines the 1st, 2nd, 3rd, 4th, 5th, 6th, 7th, 8th, 9th, 10th, 11th, and 12th features of the invention, further includes:
  a first integrated circuit chip having a driver circuit for transmitting complementary signals to the first and the second signal wirings;
  a second integrated circuit chip having a receiver circuit for receiving complementary signals transmitted through the first and the second signal wirings.

This configuration enables the high-speed transmission of the signals form the first integrated circuit chip to the second integrated circuit chip.

In the wiring substrate based on the 14th feature of the invention which further defines the 1st, 2nd, 3rd, 4th, 5th, 6th, 7th, 8th, 9th, 10th, 11th, and 12th features of the invention, the insulating materials are epoxy resin, bis (maleide) triazine (BMT), polyimide, benzocyclobutane (BCB), or fluorinated resin. As the insulating materials above contain no, or at least a very few, polarized groups, the dielectric constant becomes significantly small. One of the examples of the fluorinated resin used is aromatic fluorence.

The manufacturing method of wiring substrates based on the 15th feature of the invention includes:
  a process for forming one or a plurality of first signal wirings on a primary plane of a first substrate;
  a process for forming one or a plurality of second signal wirings on a primary plane of a second substrate;
  a process for coarsening the surface of the first and the second substrates except the surface of the first and the second signal wirings;
  a process for forming insulating materials on the entire surface of the first and the second substrates;
  a process for joining the first substrate and the second substrate using the insulating materials in between, and the first and the second signal wirings are placed in parallel facing to each other for forming signal wiring pairs.

This configuration permits the manufacturing of the wiring substrates based on the 1st and 5th features of the inventions. In this configuration, the first and the second substrates undergo a process for coarsening the surfaces thereof for improving the adhesion, however no treatment for coarsening is applied to the surfaces of the signal wirings. By keeping the smooth surfaces of the signal wirings, the increase of the electric resistance due to the skin effect is minimized.

In the manufacturing method of wiring substrates based on the 16th feature of the invention which further defines the 15th feature of the invention, among all the processes, at least, the process for joining the first substrate and the second substrate using the insulating materials in between is performed in a gas atmosphere composed of non-polarized molecules.

This configuration prevents the intake of the polarized molecules, such as water molecule, into the insulating material, and thus prohibits the increase in tan δ of the insulating material.

In the manufacturing method of wiring substrates based on the 17th feature of the invention which further defines the 15th, and the 16th invention, the insulating materials are epoxy resin, bis (maleide) triazine (BMT), polyimide, benzocyclobutane (BCB), or fluorinated resin. As the insulating materials above contain no, or at least a very few, polarized groups, the dielectric constant becomes significantly small. One of the examples of the fluorinated resin used is aromatic fluorence.

In the manufacturing method of wiring substrates based on the 18th feature of the invention which further defines 15th, and 16th features of the invention, the insulating material is thermosetting resin or thermo-plastic resin.

The manufacturing method of wiring substrates based on the 19th feature of the invention includes:
- a process for adhering a photosensitive dry film onto a primary plane of a first and a second substrates;
- a process for creating a first and a second openings at the regions for a first and a second signal wiring to be formed on the first and the second substrates using patterning of the photosensitive dry film;
- a process for forming the first and the second signal wirings in the first and the second openings using electroless plating;
- a process for joining the first substrate and the second substrate using the photosensitive dry films filled between the first and the second signal wirings, and the first and the second signal wirings are placed in parallel facing to each other for forming signal wiring pairs.

This configuration enables the manufacturing of the wiring substrates based on the 6th feature of the invention.

In the manufacturing method of wiring substrates based on the 20th features of the invention which further defines 19th feature of the invention, among all the processes, at least, the process for joining the first substrate and the second substrate using the photosensitive dry films filled between the first and the second signal wirings is performed in a gas atmosphere composed of non-polarized molecules. This configuration prevents the intake of the polarized molecules, such as water molecule, into the photosensitive dry films, and thus prohibits the increase in tan δ of the insulating material.

The manufacturing method of wiring substrates based on the 21st feature of the invention includes:
- a process for forming one or a plurality of first signal wirings on a primary plane of a first substrate;
- a process for forming one or a plurality of second signal wirings on a primary plane of a second substrate;
- a process for coarsening the surface of the first and the second substrates except the surface of the first and the second signal wirings;
- a process for forming columns made of insulating materials partially in the space between the neighboring signal wiring pairs on the surface of the first and the second substrates;
- a process for joining the first substrate and the second substrate using the columns made of the insulating material in between, and the first and the second signal wirings are placed in parallel facing to each other for forming signal wiring pairs.

This configuration enables the manufacturing of the wiring substrates of the 7th feature of the invention. Furthermore, it is possible to adjust the column height so that the distance between the signal wirings of the signal wiring pairs is kept constant.

In the manufacturing method of wiring substrates based on the 22nd feature of the invention which further defines 21st feature of the invention, among all the processes, at least, the process for joining the first substrate and the second substrate using the columns in between is performed in a gas atmosphere composed of non-polarized molecules. This configuration prevents the intake of the polarized molecules, such as water molecule, into the columns, and thus prohibits the increase in tan δ of the insulating material.

The manufacturing method of wiring substrates based on the 23rd feature of the invention includes:
- a process for forming one or a plurality of first signal wirings on a primary plane of a first substrate;
- a process for forming one or a plurality of second signal wirings on a primary plane of a second substrate;
- a process for coarsening the surface of the first and the second substrates except the surface of the first and the second signal wirings;
- a process for forming coating layers by evaporating organic materials on the surface of the first and the second substrates having the first and the second signal wirings;
- a process for joining the first substrate and the second substrate using the coating layer in between, and the first and the second signal wirings are placed in parallel facing to each other for forming signal wiring pairs.

This enables the manufacturing of the wiring substrates of the 8th feature of the invention. Furthermore, as the thickness of the coating layer determines the distance between the signal wirings of the signal wiring pairs, the same distance can be easily controlled. It is desirable to form the coating layer using materials with low tan δ.

In the manufacturing method of wiring substrates based on the 24th feature of the invention which further defines 23rd feature of the invention, among all the processes, at least, the process for joining the first substrate and the second substrate using the coating layer in between is performed in a gas atmosphere composed of non-polarized molecules. This configuration prevents the intake of the polarized molecules, such as water molecule, into the coating layer, and thus prohibits the increase in tan δ of the insulating material.

In the manufacturing method of wiring substrates based on the 25th feature of the invention which further defines 16th, 20th, 22nd, and 24th features of the invention, the gas atmosphere composed of non-polarized molecules is helium, argon, methane, ethane, or the air with at least the moisture being removed thereof.

DETAILED DESCRIPTION OF THE PREFERRED EMBODIMENTS

The first embodiment through the fifth embodiment of the present invention will be described hereinafter in reference to the FIG. 1 through FIG. 11

Figure 1:
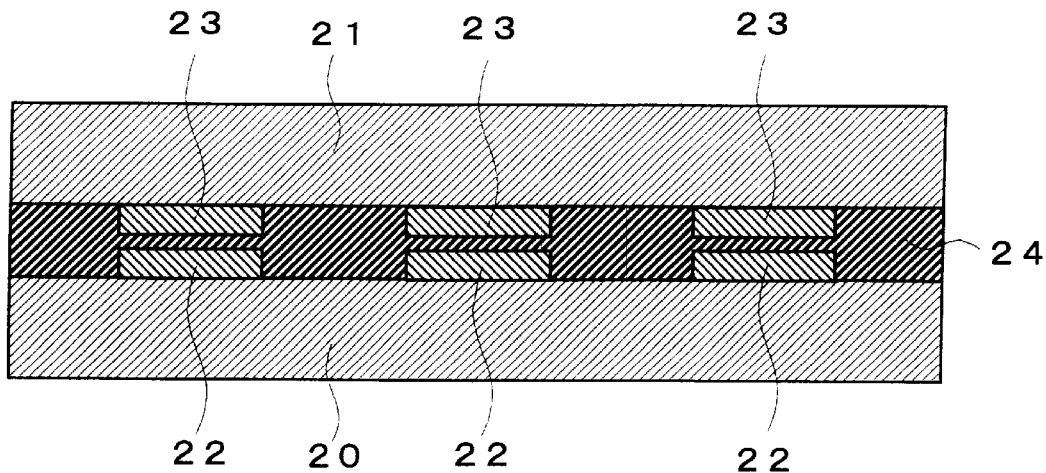
FIG. 1 is a conceptual cross-sectional view to show the first embodiment of the present invention.

First, the first embodiment will be described in reference to FIG. 1 through FIG. 4D. FIG. 1 is a conceptual cross-sectional view of a wiring substrate of the first embodiment of the present invention. This wiring structure provides the basic configuration of the present invention. The same has a first substrate 20 and a second substrate 21.

The first and the second substrates are print boards made, for example, of epoxy resins, but are not confined to the same. Other substrates including semiconductor substrates covered by insulating film can be used as the substrate in the same configuration.

A first signal wiring 22 is formed on a primary plane of the first substrate, and a second signal wiring 23 is formed on a primary plane of the second substrate. In this configuration, the faces of the first and the second signal wirings 22, 23 on the opposite side of the adhering faces to the first and the second substrates 20, 21 are overlapped to each other and placed in parallel. Though, in the present embodiment, the first and the second signal wirings 22, 23 run perpendicular to the plane of paper in FIG. 1, in other embodiment, the same can run in any direction.

Thus, the first and the second signal wirings 22, 23 form a signal wiring pair. Since this wiring structure has the first and the second wirings 22, 23 piled up, the structure can be called as a stacked pair line. The signal wiring pairs are supplied with high frequency signals in the form of complementary signals provided by a signal source such as a driver circuit. Furthermore, as described in the previous section, the first signal wiring can be used as a signal line, and the second signal wiring can be used as a reference line, though the roles are interchangeable. The signal wiring pair above, by nature, forms a transmission line with closed electromagnetic field, has small characteristic impedance, and thus is capable of high speed transmission of high frequency signals without attenuation of the signal.

An insulating material 24 lies between the primary planes of the first and the second substrates 20, 21. In this embodiment, the same insulating material fills up the entire gap between the first and the second substrates 20, 21. It is desirable to choose insulating materials 24 with low polarizability, or low tan δ, for reducing the leak current due to the dielectric loss between the signal wirings.

One such material is a resin having very few polarized groups such as epoxy resin, bis (maleide) triazine (BMT), polyimide, benzocyclobutane (BCB), and fluorinated resin (for example, aromatic fluorence).

The essence of the basic configuration above is that a pair of wiring substrates are held together by a insulating material including resins in such a manner that signal wirings thereon are placed in parallel facing to each other, providing the only one basic configuration of the wiring substrate for transmitting high frequency signals in GHz range. The present invention also provides a wiring structure which denies the concept of the "ground", or the earth free from "fluctuations", and which does not allow the signal line pairs to be placed close to large width power supply layers (including the grounds). An investigation by the inventors of the present invention shows that it is desirable for the high-speed signal transmission not to have the power supply layers in the vicinity of the signal wirings. Thus, the wiring substrate of the present invention excludes the presence of the power supply layers in the vicinity of the signal line pair, which is typified by a structure where a power supply layer is sandwiched by the signal lines of a signal line pair. Furthermore, it is only natural that the two substrates having the signal line pairs thereon are not electrically conducting.

Now, a description will be given hereinafter on the configuration for minimizing the increase in the resistance due to the skin effect, which is pointed out as one of the important issues by the inventors of the present invention. Because of the skin effect, the electric current density becomes the highest on the surfaces of the overlapping faces of the first and the second signal wirings 22, 23. If the surfaces of the signal wirings as well as other surfaces of the wiring substrates are coarsened, which is the case with the conventional print wiring techniques, the electric resistance further increases due to the skin effect multiplied by the irregular surfaces created by the coarsening. This is because the electric current flows along the irregular surface, and will lead to a large resistance loss.

Figure 2A:
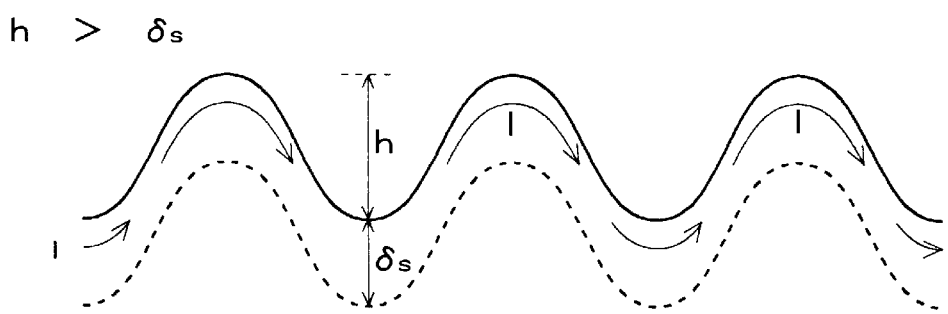
FIG. 2A and FIG. 2B are conceptual cross-sectional views to show the relationship between the roughness and the skin depth of the surfaces of the overlapping faces of the signal wirings.
Figure 2B:
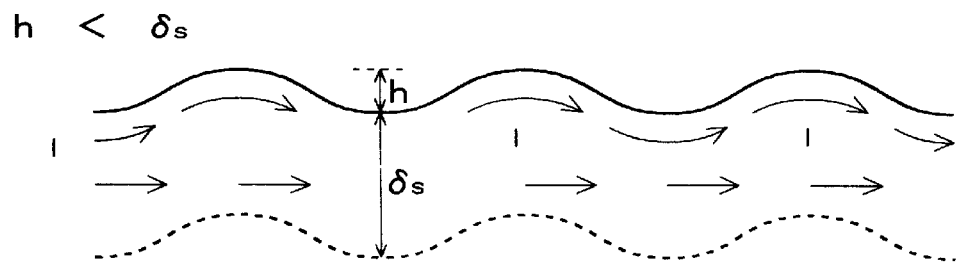

FIG. 2A and FIG. 2B are conceptual cross-sectional view to show the relationship between the skin depth and the surface roughness of the surfaces of the overlapping faces of the signal wirings.

As shown in FIG. 2A, when the peak-to-valley distance h of the surface (the height difference between the peak and the valley of the surface morphology) is larger than the skin depth $\delta_s$, most of the currents flowing in the skin region follow along the irregular surface shape, resulting in a larger increase in the electric resistance due to the elongated electric current path. On the other hand, as shown in FIG. 2B, when the peak-to-valley distance h of the surface (the height difference between the peak and the valley of the surface morphology) is smaller than the skin depth $\delta_s$, in the regions away from the surface, there is a certain components of the electric currents which flow straight without being affected by the irregular shape of the surface, though other components of the electric currents flowing very close to the surface are still subjected to the irregular shape of the surface by a minimal amount.

Thus, the smaller the surface roughness becomes in comparison to the skin depth $\delta_s$, the less becomes the effect of the surface roughness, or the irregular shape of the surface, resulting in a smaller increase in the electric resistance. In other words, it is possible to prevent further increase in the electric resistance due to the skin effect multiplied by the irregular surfaces created by the coarsening. This makes it possible to prevent the attenuation of the high frequency signals and to transmit the signals with high speed.

It should be noted that the skin depth $\delta_s$ is represented, as an approximation, by an equation, which is derived from an assumption that a ground is placed all around the signal lines. Thus, 60% of the total electric current flowing in the first signal wiring 22 is confined within in the skin depth $\delta_s$.

Though it is ideal to have a mirror plane completely free from the irregular surface shape, this can be rarely achieved by practical manufacturing processes. In reality, as an example, when copper-clad laminates are used as wiring substrates by patterning the copper foil thereof to make Cu wirings, it is only desirable to make the surface roughness lower than one third of the skin depth due to the skin effect. When a sine wave of 1 GHz is supplied to a Cu wiring, the skin depth $\delta_s$ is 2.2 µm. Thus, the preferred condition is that the surface roughness is smaller than 0.7 µm, which is one third of the surface roughness.

As for the measuring methods of the surface roughness, the conventional contact needle method is most adequate. Using this method, the surface roughness is obtained as the difference between the average height of the peaks and the average height of the valleys of the measured surface.

In the light of the current print wiring technologies, it is a common procedure to coarsen the surface of the copper foil of the copper-clad laminates using a oxidation-reduction treatment prior to the patterning process, in expectation of the anchoring effect. The original smooth surface of the copper foil can be maintained by not performing the coarsening process.

On the other hand, the surfaces of the first and the second substrates 20, 21 undergo the coarsening treatment for increasing the adhesion to the insulating material 24. As a result, the surfaces of the overlapping faces of the first and the second signal wirings 22, 23 are smoother than the surfaces of the first and the second substrates 20, 21. If required, it is possible to create a flat surface of a desired degree using a treatment for surface smoothing.

In summary of the above discussion, the increase in the electric resistance due to the skin effect can be minimized by utilizing the original smooth surfaces of the overlapping faces of the first and the second signal wirings 22, 23, or by smoothing the same surfaces.

Figure 3:
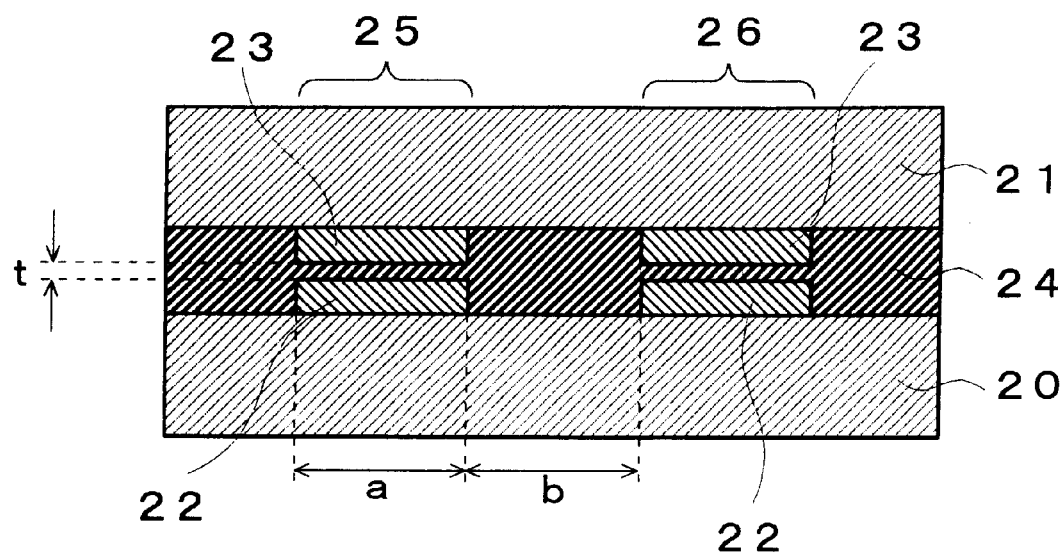
FIG. 3 is a conceptual cross-sectional view to show the configuration of two sets of the signal wiring pairs 25, 26.

Then, a description will be given hereinafter on the configuration for eliminating the neighboring interference between the signal wiring pairs when a plurality of signal wiring pairs are formed close to each other. FIG. 3 is a conceptual cross-sectional view to show a configuration having two sets of signal wiring pairs 25, 26, as an example. The configuration is such that the following relation is obtained among the distance between the first and the second signal wirings, 22, 23, t, the line width of the first and the second wirings 22, 23, a, and the distance between neighboring signal wiring pairs, 25, 26b:

$$b/(a+t) > 2.$$

In this configuration, the coupling coefficient becomes close to 1 and the neighboring interference between neighboring signal wiring pairs can be practically annihilated. Thus the same configuration can provide an ideal wiring without the loss of the electromagnetic energy.

Furthermore, it is desirable that each of the wirings of the signal wiring pairs 25, 26 has a characteristic impedance lower than 20 Ω, preferably lower than 15 Ω. The condition is desirable for transmitting high frequency digital signals in GHz range. An approximate equation for the characteristic impedance of the signal wiring pair is as follows:

$$Z_o = (h/w) \times \sqrt{\frac{\mu_o \mu_\gamma}{\varepsilon_o \varepsilon_\gamma}} \qquad (2)$$

$$= 377 \times (h/w) \times \sqrt{\frac{\mu_\gamma}{\varepsilon_\gamma}}$$

In this equation, w denotes the line width, h the distance between the signal wirings 22, 23, $\mu_o$ the magnetic permeability in vacuum, $\mu_\gamma$ the relative magnetic permeability of the insulating material, $\varepsilon_o$ the electric permittivity in vacuum, and $\varepsilon_\gamma$ the dielectric constant of the insulating material. It is seen, from the equation, that the distance between the signal wirings of a signal wiring pair t should be small for obtaining signal line pairs having characteristic impedance lower than 20 Ω, preferably lower than 15 Ω. This is in accordance with the effort for making the coupling coefficient close to 1.

In this configuration, the resin filling the space can be a foamed resin which contains a large volume of the air. Furthermore, it is within the scope of the present invention to make the cross-section of the signal wiring trapezoidal or reverse-trapezoidal in expectation of creating an electric field concentration, or parallel electric field layer.

Figure 4A:
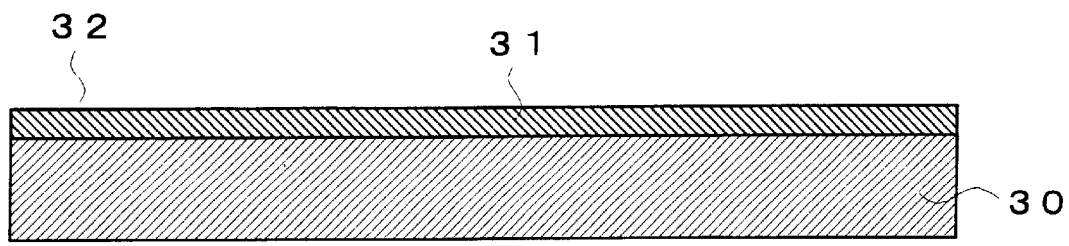
FIG. 4A, FIG. 4B, FIG. 4C and FIG. 4D are series of conceptual cross-sectional views to show a manufacturing method of the wiring substrate of the first embodiment.

Next, the manufacturing method of the wiring substrates of this embodiment will be described in detail in reference to FIG. 4A through FIG. 4D hereinafter. The process starts with a substrate 30 as shown in FIG. 4A. The substrate 30 used as a basis for forming the print wiring board is, for example, a stage B board, known as prepreg, which is made by immersing glass fibers in pre-hardening epoxy resins such as FR-4. Then, after a copper foil 31 is adhered to the substrate 30, the stage B epoxy resin is hardened, for providing the copper-clad laminate which is the base for the wiring substrate.

The next step is to pattern the copper foil using photolithography. However, there are certain issues worth attentions in the conventional methods for this step. Those will be briefly reviewed hereinafter.

First, the thin copper lines made by the photolithographic process have weak adhesion to the substrate. One of the solutions to for the adhesive strength is to coarsen the surface of the copper foil beforehand. One such method for the coarsening the surface is first to oxidize the copper foil to form a homogeneous oxidized film thereon, and then to reduce the fragile oxidized film. In general, the oxidation is performed with an acidic solution, and the reduction is performed with a reducible solution. Recently, an electroplating technique for creating rough copper surface is invented as another method. However, both methods result in a copper foil having a surface roughness of 1 µm to 5 µm. On the other hand, the skin depth for a signal frequency of 1 GHz is 2 µm, and thus comparable to the magnitude of the surface roughness. Thus, this solution is not adequate for providing the wiring structure of the present invention.

It is not entirely impossible to obtain strong chemical bonding without coarsening the surface. There is a few activated chemical species capable of forming a strong chemical bonding, typified by a covalent bonding, at low temperatures (under 200° C.), but the same activated species with a high chemical reactivity are extremely unstable and are yet to find an industrial application. A silane-coupling agent, which is in this category, decomposes within a short time because of the hydrolysis and is practically useless.

The bonding based only on the anchoring effect cannot avoid the molecular-scale separation at the interface (micro cracking), and thin water film is formed on the surface of the separation, which can nullify the anchoring effect through swelling and vaporization. In short, this leads to deteriorated life time of the bonding. Common methods for obtaining a chemical bonding are to introduce polarized groups into the sub chains of the resin for enhancing the bonding between the polarized groups. One typical polarized group is hydroxyl group and most of the organic adhesives are included in this category.

For example, epoxy resins having a large number of hydroxyl groups can be used as an adhesive, but the same resins have also large dielectric loss (tan δ) in proportional to the increase in the hydroxyl groups, resulting in a large leaking conductance G. This contradiction between the skin effect and tan δ is not only seen in the epoxy resin group such as FR-4 and FR-5, but also in bis (maleide) triazine (BT) group and polyimide group. Present invention provides a means to solve the contradiction between the skin effect and tan δ utilizing a part of the conventional techniques.

Figure 4B:
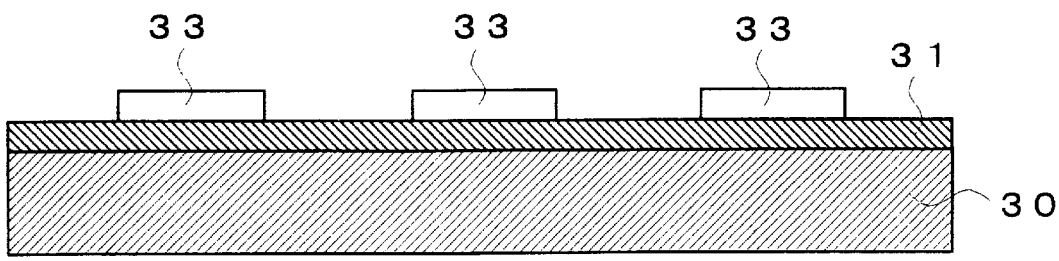

Continuing on the description of the manufacturing method of the present invention, in the next step, as shown in FIG. 4B, a photoresist layer is formed on the copper foil by a coating technique, exposed through a mask having a wiring pattern of a wiring design, and then developed for producing a patterned photoresist layer 33.

Figure 4C:
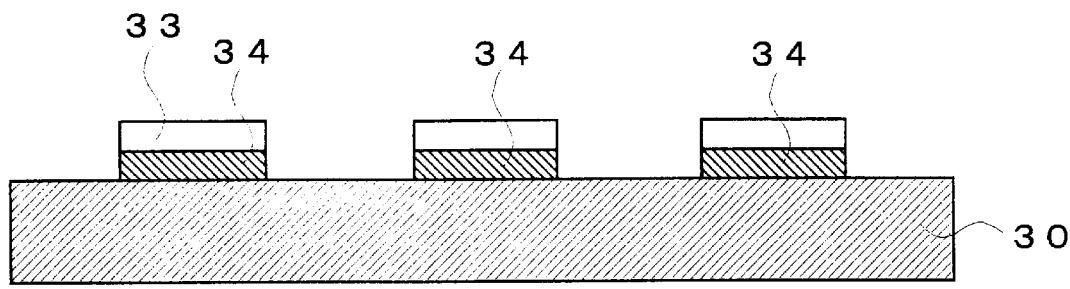

Then, as shown in FIG. 4C, the unprotected portion of the copper foil is etched by an etching solution for producing the signal wiring 34. At this point, the surface of the epoxy substrate, from which the unprotected copper foil 31 is completely removed, is not smooth as the coarsened surface of the copper foil leaves its marks on the surface of the epoxy substrate.

Figure 4D:
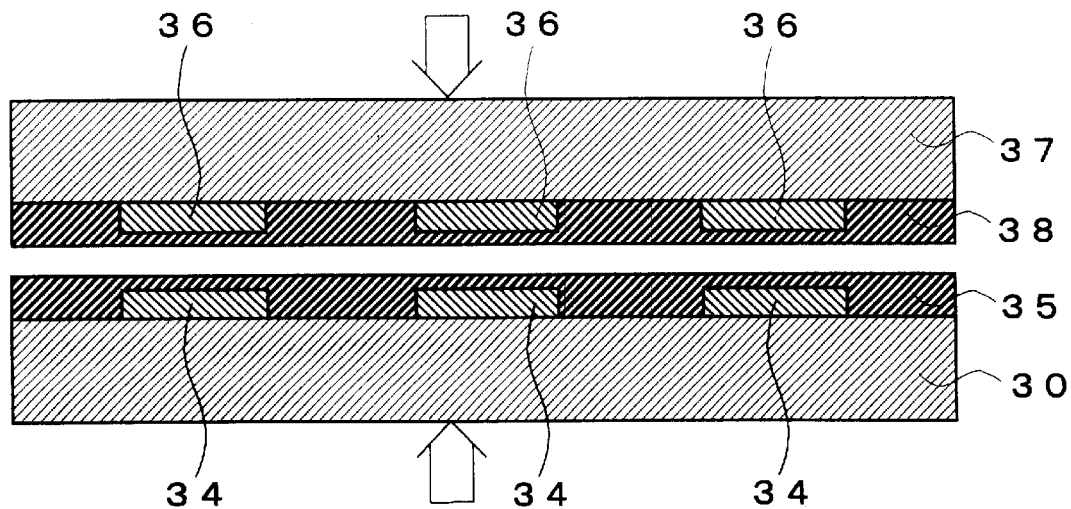

This copper-clad laminate and another copper-clad laminate processed with a different mask pattern are stuck together by a resin so that the surfaces of the copper foils face to each other. This is the basic structure of the wiring substrate of the present invention. In this process, as shown in FIG. 4D, first, a resin layer 35 is formed on the substrate 30 by a coating technique. Meanwhile, another resin layer 38 is formed on the substrate 37 having the signal wiring 36 which is formed by the same process. Finally, the substrate 30 and the substrate 37 are brought together so that the wiring patterns thereof coincide with each other, and applied a pressure for joining, or adhering, the two substrates using the resin layers 35, 38.

The resins inserted between the substrates are organic insulating materials with very few polarized groups such as epoxy resin, bis (maleide) triazine (BMT), polyimide, benzocyclobutane (BCB), and fluorinated resin (for example, aromatic fluorence).

One of the issues which are to be solved by the present invention is minimizing the increase in the electric resistance due to the skin effect, and the surfaces of signal wirings 34, 36 should be smooth for achieving this. In an actual process, this can be achieved by coarsening only the surfaces of the substrates 30, 37 and by keeping the original surface of the copper foil 31. For example, prior to the adhesion of the copper foil 31 to the substrate 30, a chemical treatment or sputtering is performed on the surface of the substrate 30 for coarsening the same surface in a molecular scale, thus providing an improved adhesion to the resin layers 35, 38.

Or, for gaining a similar result, during the process shown in FIG. 4C, a sputtering is performed selectively on the substrate 30 using the photoresist layer 33 as a mask, for coarsening the surfaces of the substrate 30 and for keeping the original surfaces of the signal wirings 34, 36.

Although the adhesive strength between the smooth copper wirings 34, 36 and the resin layers 35, 38 may be weak, the anchoring effect provides a strong adhesion as the resin penetrates into the irregular surface of the resin substrate, from which the copper foil is removed. Unlike the joining between the materials having different chemical bonding types, as in the case of metals and organic resins, a stronger adhesive strength, in general, can be obtained between the materials with the same bonding types. Furthermore, when a pre-hardening resin is added to another resin, which is already hardened, using a resin primer with small molecular weight enhances the intrusion of the chain head of the molecule into the hardened resin. If the surface of the hardened resin is not smooth, the same effect can be predominant. As a result, the adhering scheme above is capable of compensating the weak adhering strength at the smooth copper interface.

The resin layers 35, 38 inserted between the substrates are formed by thin layer application techniques (including screen-printing, submersion technique and electrophoresis), evaporation techniques, and adhesion of a thin film. It is the advantage of this process that a thin layer formation technique can be selected from the variation above depending on the material selected first for the process. Then, the via holes are created through the substrate and the conduction thereof to the pair lines is made by electroplating and other techniques, thus completing one single unit of the wiring substrate.

Although the amount of the resin 35, 38 coated on the substrates 30, 37 is controlled with a high precision, there are always fine voids in atomic or molecular scale remaining in the central portion of the space between the substrates since the pressurization is not enough for getting rid of the same voids. For avoiding the increase in tan δ caused by the inclusion of the ambient gas into the voids, which leads to the issue of production reliability, the adhering process should be performed in an gas atmosphere composed of non-polarized molecules having a large molecular radius and a high vaporization temperature such as methane and ethane so that the same gases fill the same voids.

Since a bigger gas molecule has a lower diffusion rate into the resin filling the space, the same molecule can prevent the penetration of a water molecule even when the moisture is mixed in the voids. This is typified by the well-known nitrogen hermetic seal. When the air is used during the adhering process, the polarized water molecules contained in the moisture of the air should be removed, although the air itself is not polarized.

The gap between the overlapping faces, or, more exactly, the distance between the surfaces of the overlapping faces of the signal wirings 34, 36, is 1 μm to 5 μm, while the thickness of the wiring is 3 μm to 5 μm. The width of the signal wiring is 5 μm to 20 μm, depending on the dielectric constant of the insulating material inserted in the space between the overlapping faces. It is clear that the formation of the wiring of the size above is not difficult as the thickness thereof is relatively small.

For controlling the characteristic impedance with a high precision, it cannot be tolerated to have a deviation from an ideal matching between the wiring patterns of the signal wirings 34, 46, or to have a variation of the distance of the gap between the same signal wirings. A soft X-ray projection instrument is used to control the deviation of the matching with a precision of micrometers. In the mean time, a pressure is applied to the substrates until the matching is obtained, while observing the capacitance of a standard pattern as a measure of the matching. Then, the resin layers 35, 38 are hardened by heating or cooling, depending on the type of the resin, that is thermosetting or thermoplastic. Following the above procedure, the paired substrates are laminated by the conventional prepreg technique with the one pair of the paired substrates being a unit of the laminated structure. Finally, the via holes are created through the laminated substrates and the conduction thereof to the pair lines is made by electroplating and other techniques, thus completing a multi-layer interconnect structure. The structure of the multi-layer interconnect wiring substrate will be described in detail in other embodiment of the present invention.

The second embodiment of the present invention will be described hereinafter in reference to the FIG. 5. In the first embodiment, as the insulating material 24 fills the entire space, the dielectric characteristics is generally degraded even when a low tan δ material is used, compared to the case where a gas is inserted. Thus, in the wiring substrate of this embodiment, a gas is sealed into the space between the overlapping faces, which is the area for the highest electromagnetic energy and, thus, dominates the dielectric loss characteristics.

Figure 5:
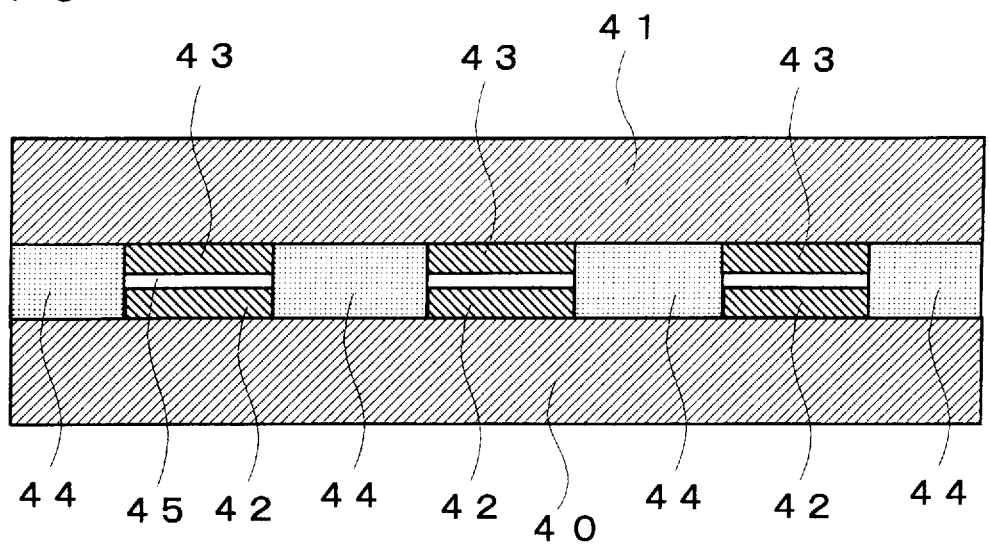
FIG. 5 is a conceptual cross-sectional view to show the second embodiment of the present invention.

Shown in FIG. 5 are a first substrate 40 and a second substrate 41. The first and the second substrates 40, 41 are print boards made, for example, of epoxy resins, but are not confined to the same. Other substrates including semiconductor substrates covered by insulating film can be used as the substrate in the same, configuration.

Also included in the figure are a first signal wiring 42 formed on a primary plane of the first substrate and a second signal wiring 43 formed on a primary plane of the second substrate. The first and the second signal wirings 42, 43 form a signal wiring pair. The signal wiring pairs are supplied with high frequency signals in the form of complementary signals provided by a signal source such as a driver circuit.

Furthermore, the first signal wiring can be used as a signal line, and the second wiring can be used as a reference line, though the roles are interchangeable. In this embodiment, the insulating material 44 is partially inserted into the space between the neighboring signal wiring pairs. A gas is sealed in the space between the first and the second signal wirings 42, 43 and the insulating material 44, or the gap between the overlapping faces 45. The gas used is composed of non-polarized molecules such as helium, argon, methane, ethane, and the air with at least the moisture being removed thereof.

In this configuration, as the space between the overlapping faces of the first and the second signal wirings is filled with a gas, only the fringe effect accounts for the dielectric loss. Thus, the dielectric loss thereof can be neglected even when the insulating material supporting the substrates has more or less high tan δ.

It should be mentioned that the other configurations disclosed in the first embodiment can be also applied to this embodiment in the same manner. One such example is the configuration in which the roughness of the surfaces of the first and the second signal wirings 42, 43 is smaller than the skin depth for minimizing the increase in the electric resistance due to the skin effect.

Second example is the configuration for eliminating the neighboring interference between the signal wiring pairs when a plurality of signal wiring pairs are formed close to each other. The configuration is such that the following relation is obtained among the distance between the first and the second signal wirings, 42, 43, t, the line width of the first and the second wirings 42, 43, a, and the distance between neighboring signal wiring pairs, b:

$$b/(a+t)>2.$$

Third example is the configuration in which the insulating material 44 is a resin having very few polarized groups such as epoxy resin, bis (maleide) triazine (BMT), polyimide, benzocyclobutane (BCB), and fluorinated resin (for example, aromatic fluorence).

The manufacturing method of the wiring substrate of this embodiment will be described hereinafter. One example of such manufacturing method is the same as the manufacturing method described above in reference to FIG. 4A through FIG. 4D except the placement of the resin layers between the pair lines. The difference is that the resin layers 44 are formed using a coating technique partially on the substrates 40, 41 and away form the signal wirings 42, 43. This is because there should be a room for the resin 44 to expand laterally, when the gap between the overlapping faces 45 is adjusted during the joining process of the first and the second substrates 40, 41. In the process to achieve this, the resin layers 44 filling the space between the signal wiring pairs are formed leaving a certain space between the same layers and the edges of the signal wirings 42, 43. Then, the resin layers 44 expand laterally and fill the space between the neighboring signal wiring pairs when the first and the second substrates 40, 41 are joined by pressing through the resin layers 44.

In another example of the manufacturing method, the substrates 40, 41 are made ready for plating treatments, and a photosensitive dry film is adhered to the same substrates. The photosensitive dry film is patterned for creating openings at the areas for the metal wiring to be created. Then, using electroless plating technique, copper layers are formed in the openings until the thickness of the layers reach a predetermined height with reference to the surface of the photosensitive dry film. Thus, the first and the second signal wirings 42, 43 are formed. When the resist film does not have enough adhesive strength to the substrates, a thin layer of adhesives is formed on the surface of the resist film using techniques such as printing after the plating process.

Finally, the two substrates are joined through the resist films in a gas atmosphere composed of non-polarized molecules such as methane and ethane, thus completing the manufacturing process of this embodiment. As the space between the overlapping faces 45 of the first and the second signal wirings is filled with a gas, only the fringe effect accounts for the dielectric loss. This is because the surface area of the overlapping faces of the first and the second signal wirings is large when the characteristic impedance of the wiring is small. Thus, the dielectric loss thereof can be neglected even when the resist film or the adhesive has more or less high tan δ.

The third embodiment of the present invention will be described hereinafter in reference to the FIG. 6. Basically, this embodiment differs from the second embodiment only in the surface area of the substrates occupied by the insulating materials. In other words, it is the difference in the amount of the empty space.

Figure 6:
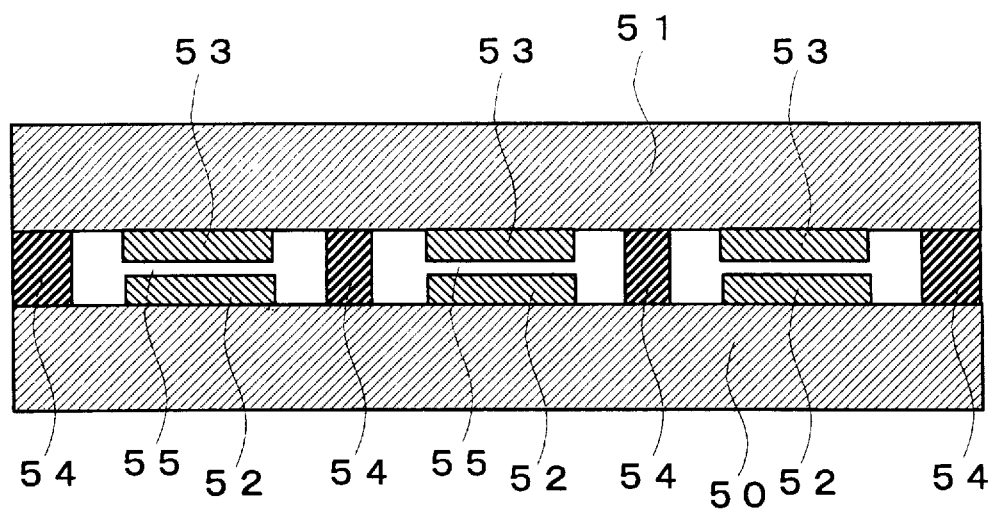
FIG. 6 is a conceptual cross-sectional view to show the third embodiment of the present invention.

Shown in FIG. 6 are a first substrate 50 and a second substrate 51. The first and the second substrates 50, 51 are print boards made, for example, of epoxy resins, but are not confined to the same. Other substrates including semiconductor substrates covered by insulating film can be used as the substrate in the same configuration.

Also included in the figure are a first signal wiring 52 formed on a primary plane of the first substrate and a second signal wiring 53 formed on a primary plane of the second substrate. The first and the second signal wirings 52, 53 form a signal wiring pair. The signal wiring pairs are supplied with high frequency signals in the form of complementary signals provided by a signal source such as a driver circuit. In this configuration, one signal wiring can be used as a signal line and the other as a reference line.

The insulating material 54 is placed partially in the space between the neighboring signal wiring pairs away from the edge of the signal wiring pairs, and a gas is sealed into the space surrounded by the first and the second signal wirings 52, 53, and the insulating material 54. This configuration can eliminate the dielectric loss including the fringe effect occurring at the signal wiring pairs. Further, this configuration has a structure which makes it easier to control the distance between the surfaces of the signal wiring pair, or the gap of the overlapping faces 55, than the second embodiment. This advantage will be described in detail hereinafter.

It should be mentioned that the other configurations disclosed in the first embodiment can be also applied to this embodiment in the same manner. One such example is the configuration in which the roughness of the surfaces of the first and the second signal wirings 52, 53 is smaller than the skin depth for minimizing the increase in the electric resistance due to the skin effect.

Second example is the configuration for eliminating the neighboring interference between the signal wiring pairs when a plurality of signal wiring pairs are formed close to each other. The configuration is such that the following relation is obtained among the distance between the first and the second signal wirings, 52, 53, t, the line width of the first and the second wirings 52, 53, a, and the distance between neighboring signal wiring pairs, b:

$$b/(a+t)>2.$$

Third example is the configuration in which the insulating material 54 is a resin having very few polarized groups such as epoxy resin, bis (maleide) triazine (BMT), polyimide, benzocyclobutane (BCB), and fluorinated resin (for example, aromatic fluorence).

The manufacturing method of the wiring substrate of this embodiment will be described hereinafter. The third embodiment differs from the second embodiment in that the surface area of the substrate occupied by the resin is smaller in the third embodiment. For the resin layers to expand laterally, the coating pattern of the resin layers should be designed so that empty spaces are created between the edge of the resin layers and the edge of the first and the second signal wirings 52, 53 during the joining process.

Furthermore, though the second embodiment has a disadvantage that controlling the thickness of the signal wirings 52, 53 formed by the plating is difficult, this can be overcome by introducing columns (insulating materials 54) made from photosensitive resist films. In this configuration, the heights of the columns are adjustable for obtaining an exact distance of the gap of the overlapping faces 55. For the adhesion of the columns, a thin layer of adhesives can be formed on the surface of the column using techniques such as printing. Also, the joining process of the substrates 50, 51 through the insulating material 54 is performed in a gas atmosphere composed of non-polarized molecules such as methane and ethane.

The fourth embodiment of the present invention will be described hereinafter in reference to the FIG. 7. In either of the first, second, or third embodiment, there is a difficulty in the processing as the space between the overlapping faces of the stacked pair lines is only a few micrometers. This embodiment provides a more accurate control of the space between overlapping faces by using an evaporation technique of organic materials.

Figure 7:
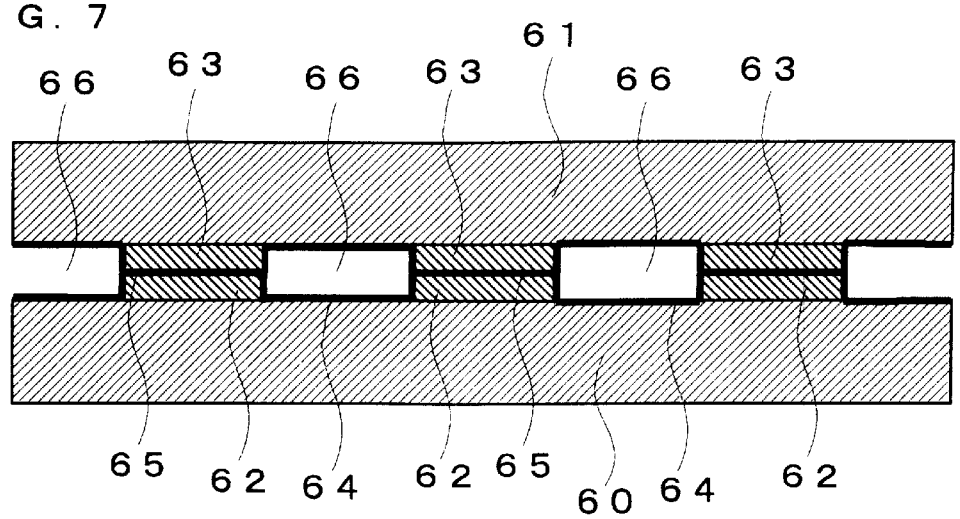
FIG. 7 is a conceptual cross-sectional view to show the fourth embodiment of the present invention.

Shown in FIG. 7 are a first substrate 60 and a second substrate 61. The first and the second substrates 60, 61 are print boards made, for example, of epoxy resins, but are not confined to the same. Other substrates including semiconductor substrates covered by insulating film can be used as the substrate in the same configuration.

Also included in the figure are a first signal wiring 62 formed on a primary plane of the first substrate and a second signal wiring 63 formed on a primary plane of the second substrate. The first and the second signal wirings 62, 63 form a signal wiring pair. The signal wiring pairs are supplied with high frequency signals in the form of complementary signals provided by a signal source such as a driver circuit. In this configuration, one signal wiring can be used as a signal line and the other as a reference line.

The coating layers 64 are formed by evaporating organic materials on the surfaces of the first and the second substrates 60, 61 including the first and the second signal wirings 62, 63, and adhered to each other at surfaces of the first and the second signal wirings 62, 63. Thus, the distance between the overlapping faces 65 is determined by the thickness of the coating layer.

There are the empty spaces 66 between the neighboring signal wirings, into which a gas is sealed. The gas used is composed of non-polarized molecules such as helium, argon, methane, ethane, and the air with at least the moisture being removed thereof. In this configuration, it is easy to control the distance between the overlapping faces of the signal wiring pairs, as the same distance is determined by the thickness of the coating layer 64. It is desirable to choose a material for the coating layer 64 with a low tan δ.

It should be mentioned that the other configurations disclosed in the first embodiment can be also applied to this embodiment in the same manner. One such example is the configuration in which the roughness of the surfaces of the first and the second signal wirings 62, 63 is smaller than the skin depth for minimizing the increase in the electric resistance due to the skin effect.

Second example is the configuration for eliminating the neighboring interference between the signal wiring pairs when a plurality of signal wiring pairs are formed close to each other. The configuration is such that the following relation is obtained among the distance between the first and the second signal wirings, 62, 63, t, the line width of the first and the second wirings 62, 63, a, and the distance between neighboring signal wiring pairs, b:

$$b/(a+t)>2.$$

The manufacturing method of the wiring substrate of this embodiment will be described hereinafter. First, the first and the second signal wirings 62, 63 are formed using the same processes as described in the manufacturing method of the first embodiment shown in FIGS. 4A through 4D. Then, the resin layer is formed on the substrates by an evaporation process which controls the thickness of the coating layer so that the gap of the overlapping faces 65, or the distance between the overlapping faces of the pair lines, is 1 μm to 5 μm with precision. One example of the organic material is perylene, and the resin layers are adhered to each other during the joining process, which is performed in a gas atmosphere composed of non-polarized molecules such as methane and ethane. Though the void free from the insulating material is created at the empty space 66, not in the space between the signal wirings, this does not pose any problem if the insulating layer covering the substrate is made of a material with small tan δ.

As a natural extension of this manufacturing method, it is also possible to apply the manufacturing processes of the first embodiment described in reference to FIG. 4A through FIG. 4D to the coating layer 64 after the hardening of the evaporated resin.

That is, a resin is further applied on the coating layer 64, and the substrates are joined together through the resin layers by pressing the substrates. By adjusting the pressure, it is possible to squeeze the applied resin out of the gap of the overlapping faces 65 almost without residual resins remaining, thus determining the distance of the gap of overlapping faces 65 with precision practically by the thickness of the coating layer 64. This configuration is also included within the present invention.

Besides the evaporation of perylene, other methods for forming the coating layer of this embodiment include spin coating, and polymerization by drying of a film formed by submersing the substrates in a dilute solution having organic spacers.

In another extension of the manufacturing method of this embodiment, copper foils are adhered to polyimide or polyester films, and then patterned by the methods of the first embodiment described in reference to FIG. 4A through FIG. 4D, resulting in a similar structure as the TAB. When the films are adhered together with the patterned copper foils facing appropriately to each other, a roller with a large curvature presses the two films so that the resin used for the adhesion is squeezed from the space between the copper wirings area where a thin hardened resin-coating layer serves as the spacer to maintain the proper spacing. In this configuration, a reel-to-reel process can be applied.

The fifth embodiment of the present invention will be described hereinafter in reference to the FIG. 8. In this configuration, the wiring substrates of the first through forth embodiments described above serve as a unit for constructing a multi-layer interconnect wiring substrate. Thus, the wiring at each layer is composed of the stacked pair lines.

Figure 8:
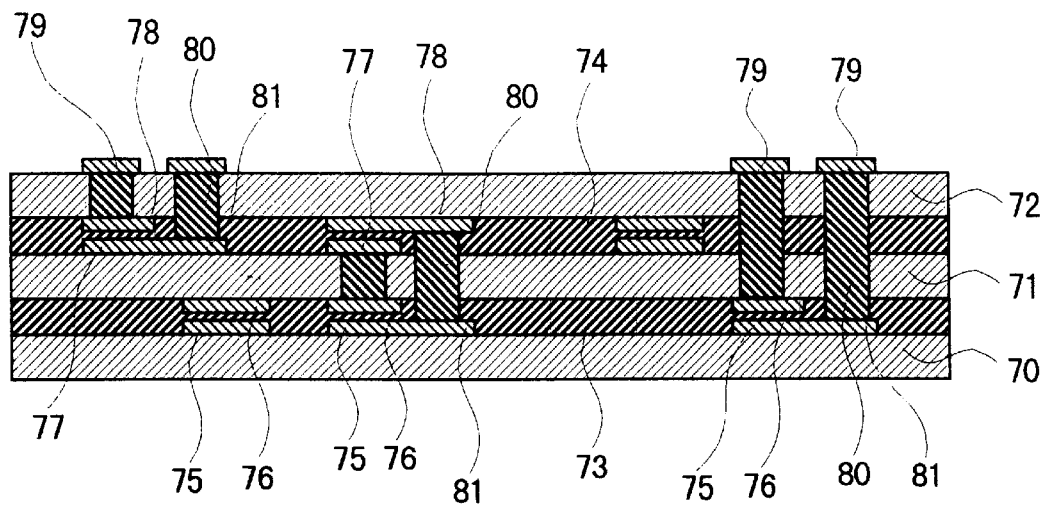
FIG. 8 is a conceptual cross-sectional view to show the fifth embodiment of the present invention.

The FIG. 8 shows an example of a three-layer interconnect wiring substrate. The first, second, and third substrates 70, 71, 72 are joined through the insulating layers 73, 74. Between the first and the second substrates 70, 71, the signal wirings 75, 76 are formed as the signal wiring pair in the first layer, and between the second and the third substrates 71, 72, the signal wirings 77, 78 are formed as the signal wiring pair in the second layer. The pad for the electric connection 79 is formed as a part of the wiring of the uppermost layer on the third substrate 72. The couple of the parallel signal wirings 75, 76 and another couple 77, 78 form the signal wiring pairs.

The signal wiring pairs in the layers are interconnected by buried via formed through the substrates, or by buried via formed through the substrates and supporting structures for the substrate in the layers. As an example, the signal wirings 75, 76 in the first layer and the signal wirings 77, 78 in the second layer are interconnected through the buried via 80.

Each buried via has a via-land 81. The via-land is extended from the wiring, is wider than the signal wirings, and forms the base of the buried via 80.

Figure 9:
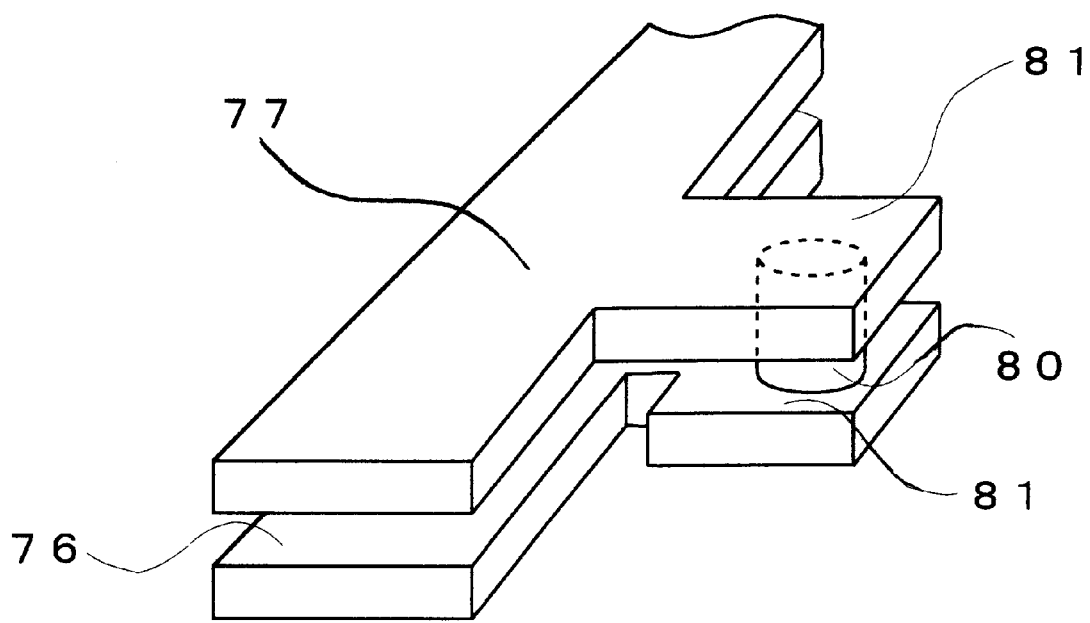
FIG. 9 is a conceptual perspective view to show a structure where electric connection between the signal wirings in each layer is made by the buried via.

FIG. 9 is a conceptual perspective view to show a structure where electric connection between the signal wirings in each of the layers is made by the buried via. Shown in the figure are the signal wiring in the first layer 76 and the signal wiring in the second layer 77. As the signal wirings are separated by the substrate 71 (not shown in the figure), the interconnection is made by forming the varied via 80 on the via-land 81 extended form each wring.

The same connection scheme applies to the electric connection between the signal wirings 75, 76 in the first layer and the connection pad 79 in the third layer, as well as the electric connection between the second wirings 77, 78 in the third layer and the connection pad 79 in the third layer. Finally, the integrated circuit chips are mounted on the wiring substrate through the connection pad 79.

In an ideal configuration, the thickness of the substrates 70, 71, 72 are in the range of 10 µm for avoiding the difficulty of forming the via-holes through the same and the disturbance of the high frequency transmission caused by long via-holes. Being used in such a thin form requires a high elastic module of the substrate material, and the candidates include glass plates and resins having high-density three-dimensional network structure. Glass plates are not supposed to brake when it is thin and flexible.

For a use as a computer board, the units of the overlapped wiring faces are laminated for forming a 4 to 6 layer structure, resulting in a overall thickness of about 100 µm. In general, silicon LSI chips of a thickness less than 50 µm are mounted on the substrate. This configuration is also included within the present invention.

It should be mentioned that the other configurations disclosed in the first through the fourth embodiments can be also applied to the wiring structures in the layer of this embodiment in the same manner. One such example is the configuration in which the roughness of the surfaces of the signal wirings 75, 76 in the first layer and the signal wirings 77, 78 in the second layer is smaller than the skin depth for minimizing the increase in the electric resistance due to the skin effect.

Second example is the configuration for eliminating the neighboring interference between the signal wiring pairs when a plurality of signal wiring pairs are formed close to each other. The configuration is such that the following relation is obtained among the distance between the signal wirings 75, 76, t, the line width of the first and the second wirings, a, and the distance between neighboring signal wiring pairs, b:

$$b/(a+t)>2.$$

Third example is the configuration in which the insulating layer 73, 74 is made of a resin having very few polarized groups such as epoxy resin, bis (maleide) triazine (BMT), polyimide, benzocyclobutane (BCB), and fluorinated resin (for example, aromatic fluorence).

The manufacturing methods described in the first through the fourth embodiments apply to the manufacturing of the substrates of this embodiment. Also, the paired substrates are laminated by the conventional prepreg technique with the one pair of the adhered substrates being a unit of the laminated structure. Finally, the via holes are created through the laminated substrates and the conduction thereof to the pair lines is made by electroplating and other techniques, thus completing a multi-layer interconnect structure shown in FIG. 8.

Figure 10:
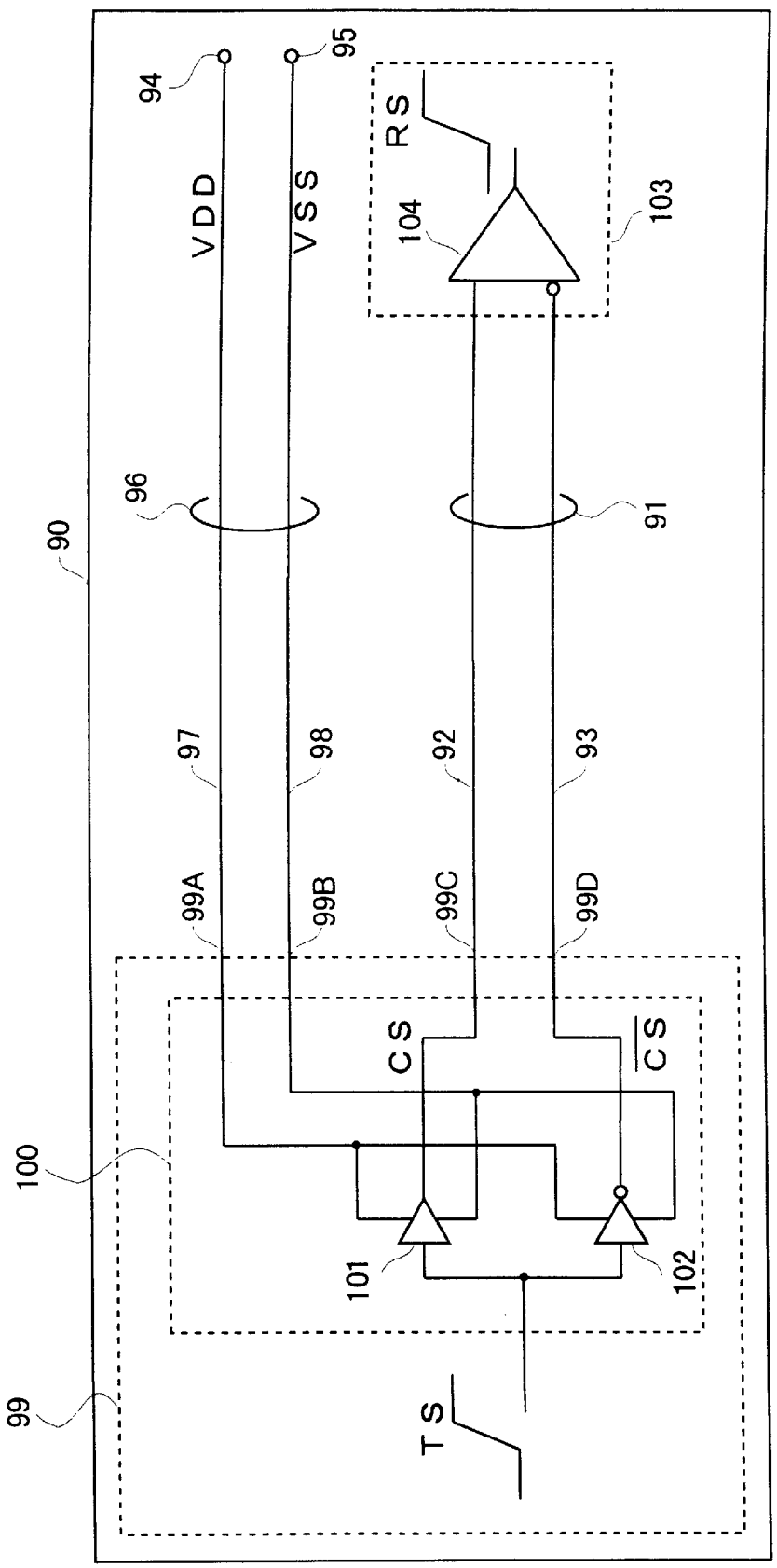
FIG. 10 is a conceptual view to show the first example of the wiring substrate having the stacked pair lines and integrated circuit (IC) chip thereon.

Now, descriptions will be given on the wiring substrates having the stacked pair lines described above and integrated circuit (IC) chips mounted thereon. All the structures of the wiring substrates and all the manufacturing methods thereof disclosed in the first through fifth embodiments apply to the wiring substrates of this type. FIG. 10 is a conceptual view to show the first example of such wiring substrate.

FIG. 10 shows the wiring substrate 90, and the signal wiring pair 91 composed of the signal wirings 92, 93 which are equal in the length and placed in parallel on the same substrate 90. Also shown in the figure are the power supply voltage input terminal 94 mounted on the wiring substrate 90 for supplying positive voltage VDD, and the ground voltage input terminal 95 mounted on the wiring substrate 90 for supplying the ground voltage VSS.

The power supply wiring 97 and the ground wiring 98 are equal in the length and placed in parallel on the wiring substrate 90 for forming a power-ground pair 96, the characteristic impedance of which is equal to the characteristic impedance of the signal wiring pair. This power-ground pair 96 can exclude the presence of the power supply layers in the vicinity of the signal wiring pair.

An integrated circuit chip (a CPU chip for example) 99 is mounted on the wiring substrate 90. The power supply voltage input terminal 99A and the ground voltage input terminal 99B of the integrated circuit are connected to the power wiring 97 and the ground wiring 98, respectively. In the mean time, the signal output terminals 99C, 99D are connected to the signal wirings 92, 93.

The integrated circuit chip 99 has a differential driver 100 which transforms the digital signal TS provided by an internal circuit (not shown in the figure) into a pair of complementary transmission digital signals CS, /CS, and supplies the complementary transmission digital signals CS, /CS to the signal wirings 92, 93 through the signal output terminals 99C, 99D. The differential driver 100 has a non-inverting driver (non-inverter) 101 and an inverter 102.

An integrated circuit chip (a main memory chip for example) 103 is mounted on the wiring substrate 90. The signal input terminals 103A, 103B of the integrated circuit are connected to the signal wirings 92, 93, respectively.

The integrated circuit chip 103 has a differential receiver 104 which transforms the complementary transmission digital signals CS, /CS received through the signal wirings 92, 93 into the receiving digital signal RS corresponding to the transmission digital signal TS, and supplies the receiving digital signal RS to an internal circuit (not shown in the figure).

Thus, the wiring substrate above provides a basis for assembling an electronic device or a digital system by mounting the integrated circuit chips 99, 103 on the same substrate having the signal wiring pairs 91 and the power-ground pair 96.

In this configuration, the signal wiring pairs 91 and the power-ground wiring pairs 96 are composed of the stacked pair lines which are formed on the surface of a pair of the substrates and faced to each other through the insulating materials, and which are disclosed in the first through fourth embodiments.

Furthermore, when the system has a large number of the signal wiring pairs 91 and the power-ground wiring pairs 96, the multi-layer interconnect wiring substrates disclosed in the fifth embodiment can be used for achieving a high density wiring. The integrated circuits chips 99, 103 are mounted on the same multi-layer interconnect wiring substrate. Thus, the wiring substrate of the present invention makes it possible to transmit and receive the digital signal in the GHz range between the integrated circuit chips 99, 103.

Figure 11:
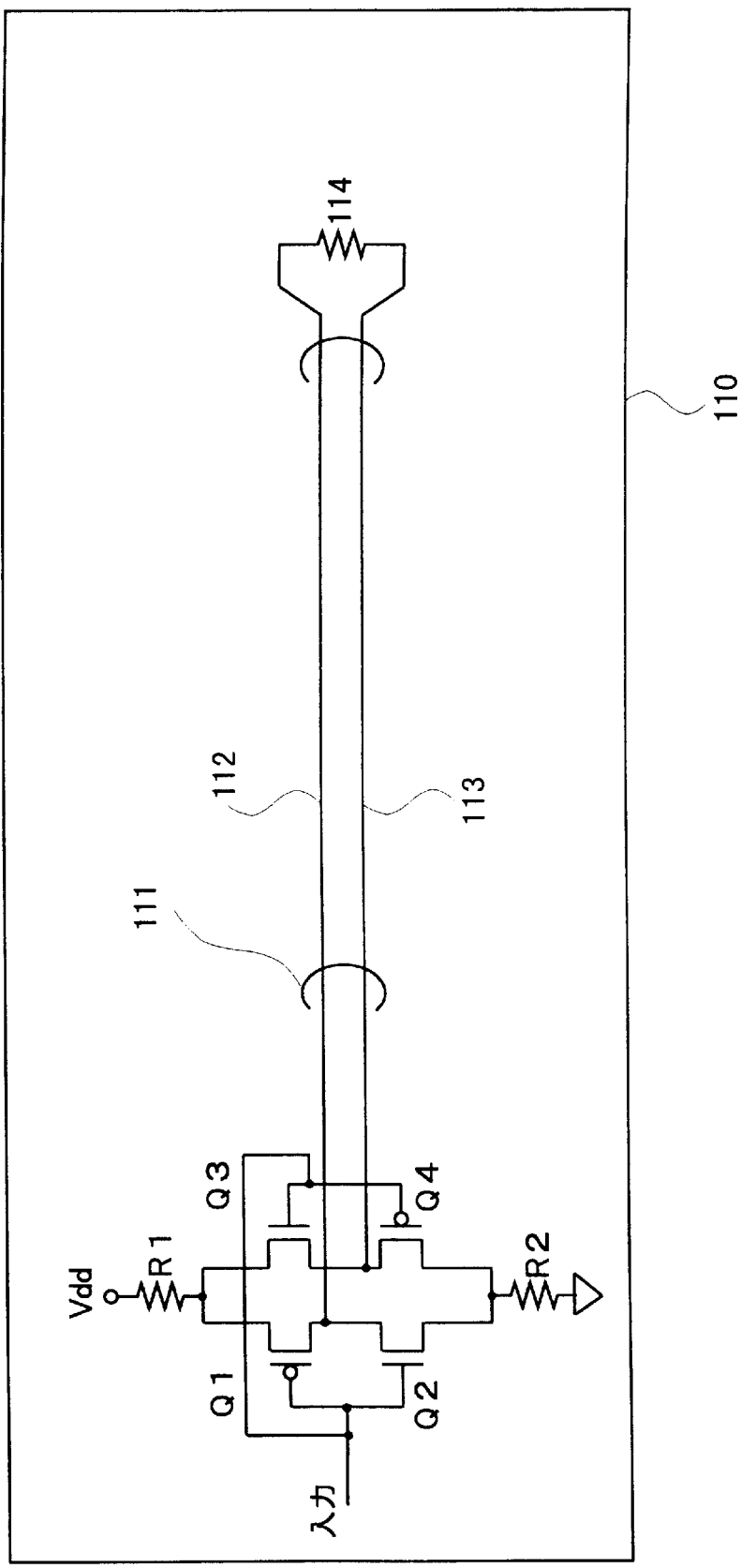
FIG. 11 is a conceptual view to show the second example of the wiring substrate having the stacked pair lines and integrated circuit (IC) chip thereon.
Figure 12:
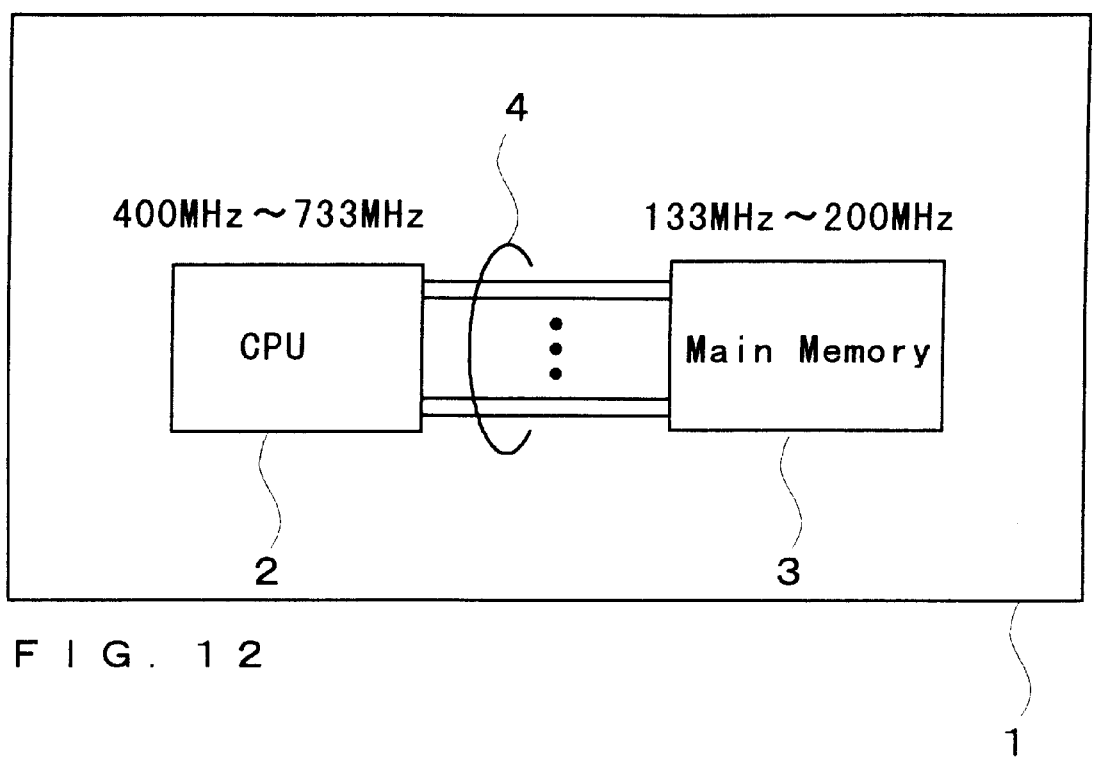
FIG. 12 is a conceptual view to show the conventional wiring board having the integrated circuit chip thereon.
Figure 13A:
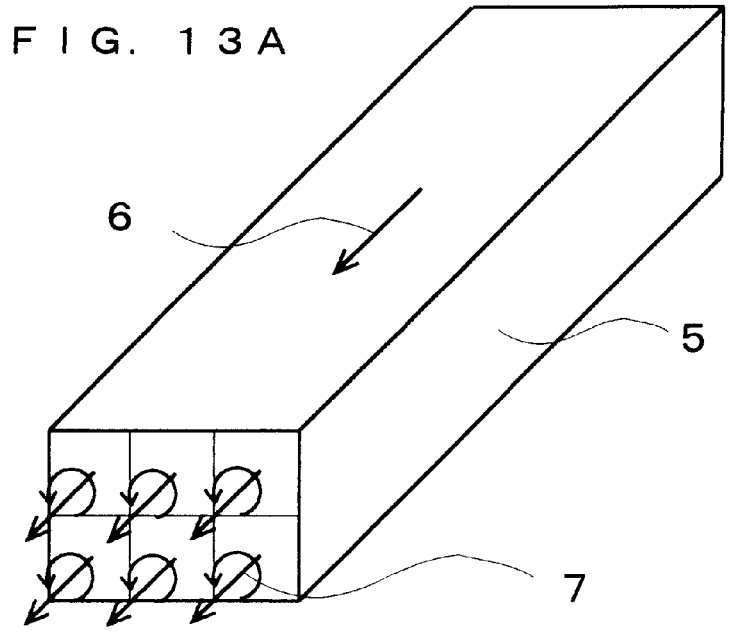
FIG. 13A and FIG. 13B are conceptual views to show the skin effect occurring in the signal wirings.
Figure 13B:
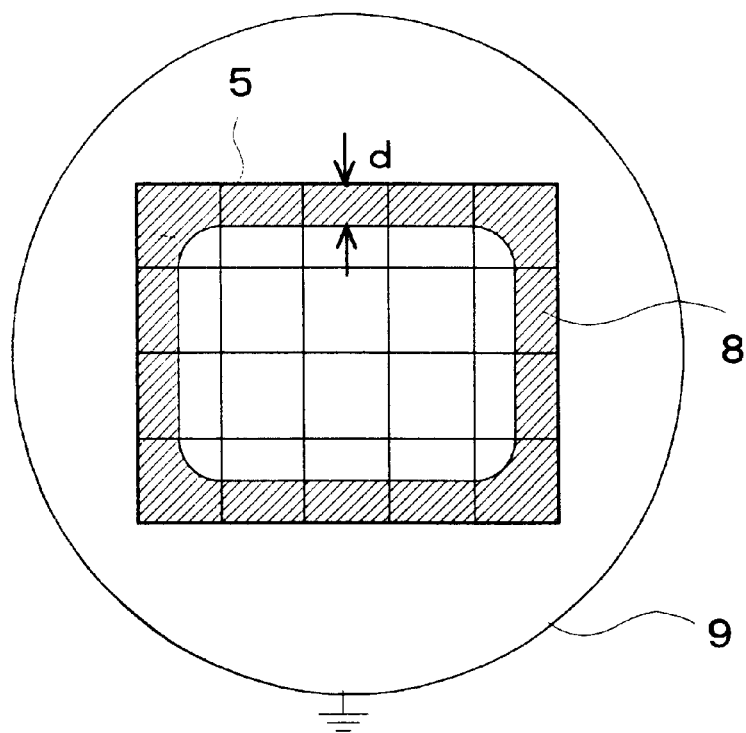
Figure 14A:
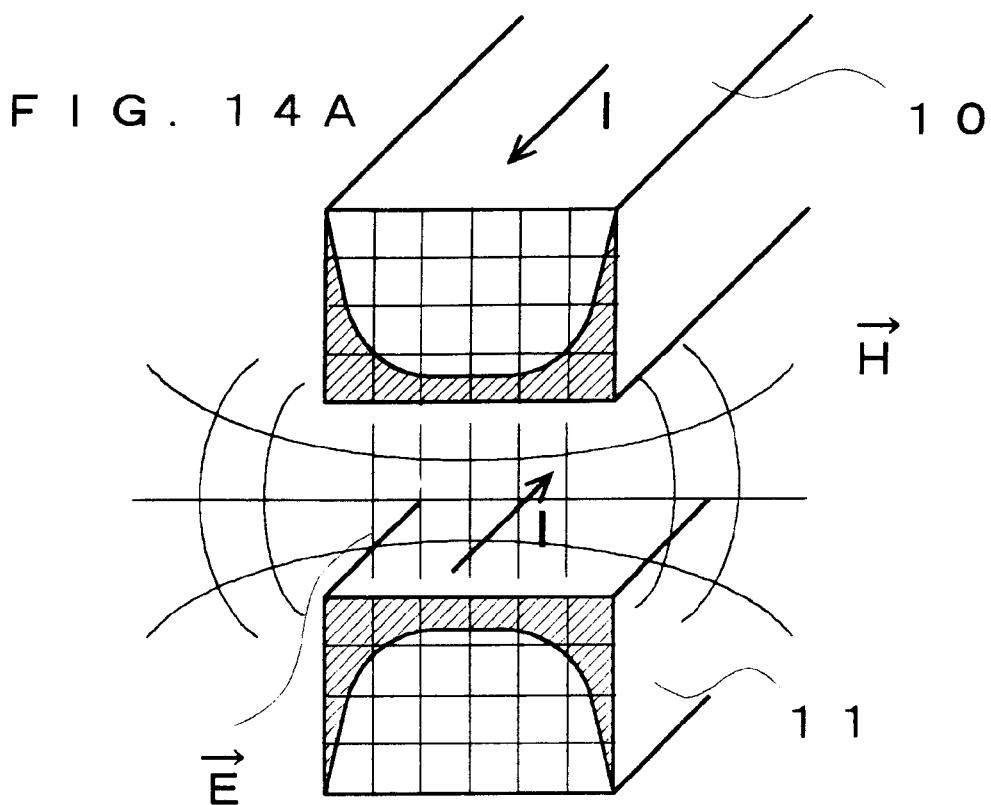
FIG. 14A and FIG. 14B are conceptual views to show the skin effect occurring in the signal wiring pair.
Figure 14B:
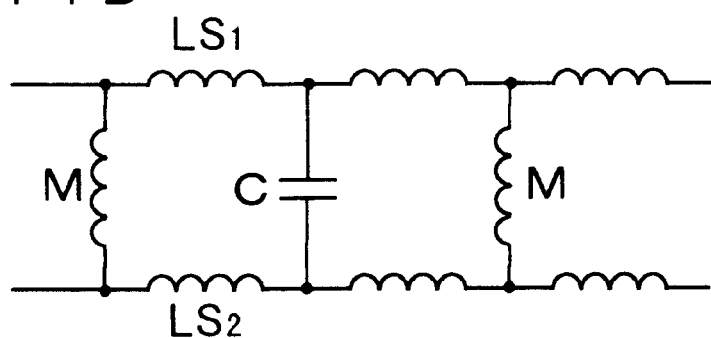
Figure 15:
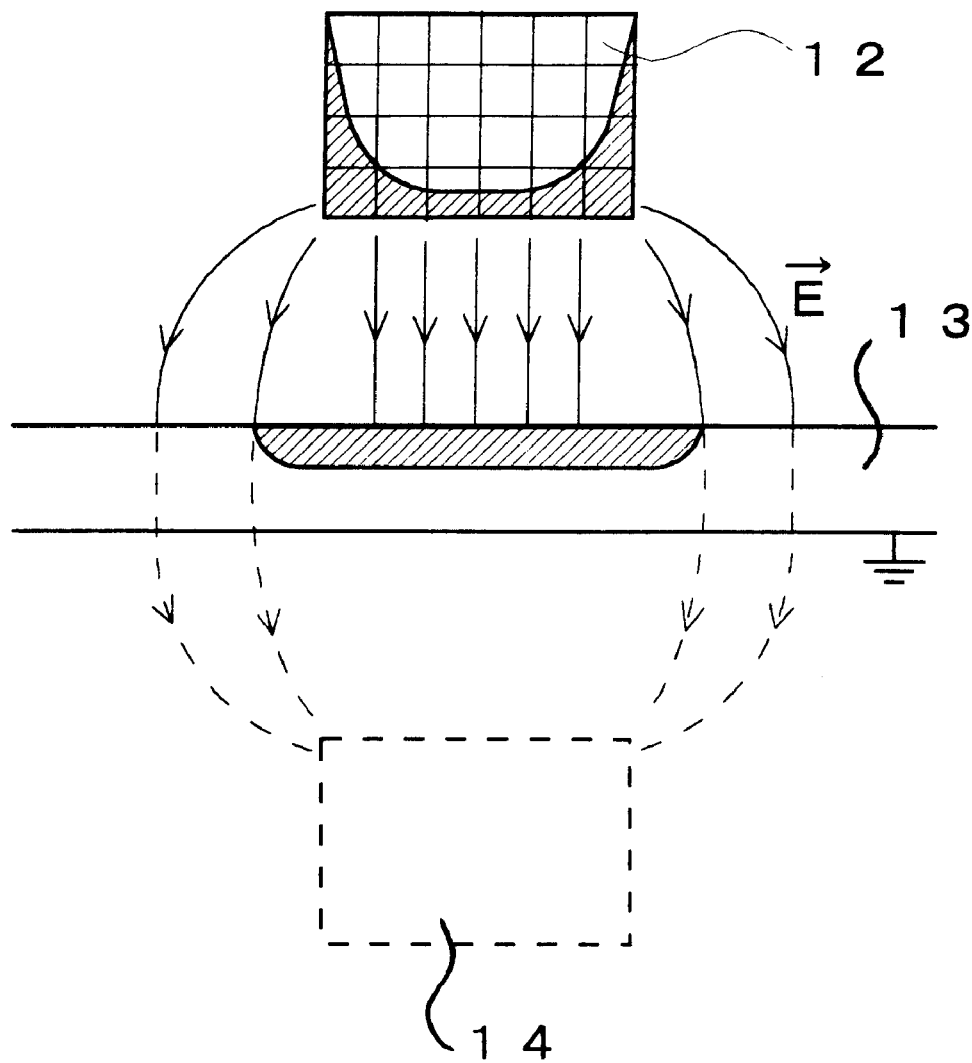
FIG. 15 is a conceptual view to show the skin effect occurring in the micro strip line.

FIG. 11 is a conceptual view to show the second example of the wiring substrate having the stacked pair lines and integrated circuit chip thereon. All the structures of the wiring substrates and all the manufacturing methods thereof disclosed in the first through fifth embodiments apply to the wiring substrates of this type.

FIG. 11 shows the wiring substrate 110, and the signal wiring pair 111 composed of the signal wirings 112, 113 which are equal in the length and placed in parallel on the same substrate 110. Also shown in the figure is a terminal resistor 114 serving as a terminal circuit with the impedance matching. Thus, the wiring substrate above provides a basis for assembling an electronic device or a digital system by mounting the integrated circuit chips having functional elements such as a differential driver 115 on the same substrate having the signal wiring pairs 111 and the terminal resistor 114.

In this configuration, the signal wiring pairs 111 are composed of the stacked pair lines which are formed on the surface of a pair of the substrates and faced to each other through the insulating materials, and which are disclosed in the first through fourth embodiments.

Furthermore, when the system has a large number of the signal wiring pairs 111, the multi-layer interconnect wiring substrates disclosed in the fifth embodiment can be used for achieving a high density wiring. The integrated circuit chips having functional elements such as a differential driver 115 are mounted on the same multi-layer interconnect wiring substrate. Thus, the wiring substrate of the present invention makes it possible to transmit the digital signal in the GHz range from the differential driver to the signal wiring pair 111.

From the invention thus described based on the embodiments, it will be obvious that the invention is not confined to the described embodiments, and that the invention may be varied in many ways. Such variations are not to be regarded as a departure from the spirit and the scope of the invention, and all such modifications are intended for inclusion within the scope of the following claims.

What is claimed is:

1. A wiring substrate comprising:

one or more first signal wirings formed on a primary plane of a first substrate;

one or more second signal wirings formed on a primary plane of a second substrate; and an insulating material inserted between said primary plane of said first substrate and said primary plane of said second substrate;

wherein said first and said second signal wirings are placed in parallel facing to each other to create a signal wiring pair, and wherein said insulating material is inserted into the space between the neighboring signal wiring pairs, and a gas is sealed into the space surrounded by said first and said second signal wirings and said insulating material.

2. A wiring substrate according to claim 1, wherein said insulating material is also placed partially in the space between the neighboring signal wiring pairs away from the edge of said signal wiring pairs.

3. A wiring substrate according to claim 1, wherein said insulating material is formed as coating layers on said first and said second substrates having said first and said second signal wirings thereon, and said coating layers are joined together on said first and said second signal wirings, and wherein a gas is sealed into the space between signal wiring pairs.

4. A wiring substrate according to claim 1, 2 or 3, wherein said gas is a non-polarized gas.

5. A wiring substrate according to claim 4, further comprising:

a first integrated circuit chip having a driver circuit for transmitting complementary signals to said first and said second signal wirings;

a second integrated circuit chip having a receiver circuit for receiving complementary signals transmitted through said first and said second signal wirings.

6. A wiring substrate according to claim 4, wherein said insulating materials are selected from the group consisting of epoxy resin, bis (maleide) triazine (BMT), polyimide, benzocyclobutane (BCB) and fluorinated resin.

7. A wiring substrate comprising:

a plurality of substrates laminated with insulating materials provided in between adjacent first and second substrates, so that first signal wirings formed on said first substrates and second signal wirings formed on said second substrates are placed in parallel facing to each other to form a plurality of layers of signal wiring pairs; and at least one buried via formed through said substrates or formed through said first and second substrates and supporting structures of the first and second substrates for interconnecting said signal wiring pairs.

8. A wiring substrate according to claim 7, wherein pads for electric connection are formed on the uppermost substrate among said plurality of laminated substrates, and said pads for electric connection are connected directly to said signal wiring pairs or by said buried via, and wherein electric components are mounted on said uppermost substrate using said pads for electric connection.

9. A wiring substrate according to claim 7 or 8, wherein said buried via is are formed on via lands extending from said first signal wirings and said second signal wirings.

10. A wiring substrate according to claim 9, further comprising:

a first integrated circuit chip having a driver circuit for transmitting complementary signals to said first and said second signal wirings;

a second integrated circuit chip having a receiver circuit for receiving complementary signals transmitted through said first and said second signal wirings.

11. A wiring substrate according to claim 9, wherein said insulating materials are selected from the group consisting of epoxy resin, bis (maleide) triazine (BMT), polyimide, benzocyclobutane (BCB) and fluorinated resin.

12. A wiring substrate according to claim 1, 2, 3, 7 or 8, further comprising:

a first integrated circuit chip having a driver circuit for transmitting complementary signals to said first and said second signal wirings;

a second integrated circuit chip having a receiver circuit for receiving complementary signals transmitted through said first and said second signal wirings.

13. A wiring substrate according to claim 1, 2, 3, 7 or 8, wherein said insulating materials are selected from the group consisting of epoxy resin, bis (maleide) triazine (BMT), polyimide, benzocyclobutane (BCB) and fluorinated resin.

* * * * *